United States Patent
Komasaki

(10) Patent No.: US 10,256,022 B2
(45) Date of Patent: Apr. 9, 2019

(54) MAGNETIC FIELD GENERATOR, MAGNETIC SENSOR SYSTEM AND MAGNETIC SENSOR

(71) Applicant: TDK CORPORATION, Tokyo (JP)

(72) Inventor: Yosuke Komasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 117 days.

(21) Appl. No.: 15/185,787

(22) Filed: Jun. 17, 2016

(65) Prior Publication Data
US 2016/0370438 A1 Dec. 22, 2016

(30) Foreign Application Priority Data
Jun. 22, 2015 (JP) .................. 2015-124345

(51) Int. Cl.
| | | |
|---|---|---|
| G01R 33/06 | (2006.01) | |
| H01F 7/02 | (2006.01) | |
| G01R 33/09 | (2006.01) | |

(52) U.S. Cl.
CPC ........... *H01F 7/0294* (2013.01); *G01R 33/09* (2013.01)

(58) Field of Classification Search
CPC .... G01N 27/30; G01N 27/72; G01N 27/9033; G01R 15/20; G01R 33/0283; G01R 33/38; G01R 33/093; G01R 33/0206; G01R 33/028; G11C 19/085; H01F 7/0273; H01F 10/3286; H01F 10/329; H01F 10/3295; G01V 3/10
USPC .......................... 324/228, 232, 239, 243, 260
See application file for complete search history.

(56) References Cited

U.S. PATENT DOCUMENTS

| | | | |
|---|---|---|---|
| 6,088,195 A * | 7/2000 | Kamiguchi | B82Y 10/00 257/E43.004 |
| 6,129,957 A | 10/2000 | Xiao et al. | |
| 6,221,172 B1 * | 4/2001 | Saito | B82Y 10/00 148/108 |
| 6,870,715 B2 | 3/2005 | Umetsu | |
| 9,032,808 B2 * | 5/2015 | Giddings | G01R 33/091 73/779 |
| 2009/0237094 A1 * | 9/2009 | Takahashi | B82Y 25/00 324/693 |
| 2010/0128518 A1 * | 5/2010 | Min | B82Y 10/00 365/171 |

(Continued)

FOREIGN PATENT DOCUMENTS

| | | |
|---|---|---|
| JP | H11-328624 A | 11/1999 |
| JP | 2009-042105 A | 2/2009 |

*Primary Examiner* — Tung X Nguyen
*Assistant Examiner* — Robert P Alejnikov, Jr.
(74) *Attorney, Agent, or Firm* — Oliff PLC

(57) ABSTRACT

A magnetic field generator includes a plurality of magnetic field generation units arranged in a predetermined pattern to generate a plurality of external magnetic fields. Each of the plurality of magnetic field generation units includes a first ferromagnetic material section and a first antiferromagnetic material section. The first antiferromagnetic material section is in contact with and exchange-coupled to the first ferromagnetic material section. The first ferromagnetic material section has its overall magnetization. The plurality of magnetic field generation units include two magnetic field generation units configured so that the overall magnetizations of their respective first ferromagnetic material sections are in different directions from each other.

20 Claims, 16 Drawing Sheets

(56) References Cited

U.S. PATENT DOCUMENTS

| | | | | |
|---|---|---|---|---|
| 2012/0212217 A1* | 8/2012 | Engel | ............... | G01R 33/098 |
| | | | | 324/252 |
| 2014/0292322 A1* | 10/2014 | Yamazaki | ............ | G01R 33/093 |
| | | | | 324/252 |
| 2015/0070005 A1* | 3/2015 | Suzuki | ............... | G01R 33/10 |
| | | | | 324/232 |

* cited by examiner

MAGNETIC FIELD GENERATOR, MAGNETIC SENSOR SYSTEM AND MAGNETIC SENSOR

BACKGROUND OF THE INVENTION

1. Field of the Invention

The present invention relates to a magnetic field generator including a plurality of magnetic field generation units, and to a magnetic sensor system and a magnetic sensor each including the magnetic field generator.

2. Description of the Related Art

In recent years, magnetic sensor systems have been employed to detect a physical quantity associated with the rotational movement or linear movement of a moving object in a variety of applications. U.S. Patent Application Publication No. 2014/0292322 A1 discloses a magnetic sensor system that includes a scale and a magnetic sensor and is configured so that the magnetic sensor generates a signal associated with the relative positional relationship between the scale and the magnetic sensor.

The magnetic sensor includes a magnetic detection element for detecting a magnetic field to be detected. Hereinafter, the magnetic field to be detected will be referred to as the target magnetic field. U.S. Patent Application Publication No. 2014/0292322 A1 discloses a magnetic sensor that uses a so-called spin-valve magnetoresistance (MR) element as the magnetic detection element. The spin-valve MR element includes a magnetization pinned layer having a magnetization pinned in a certain direction, a free layer having a magnetization that varies depending on the target magnetic field, and a nonmagnetic layer located between the magnetization pinned layer and the free layer. Examples of the spin-valve MR element include a TMR element in which the nonmagnetic layer is a tunnel barrier layer, and a GMR element in which the nonmagnetic layer is a nonmagnetic conductive layer.

The scale of the magnetic sensor system includes a plurality of magnetic field generation units arranged in a predetermined pattern to generate a plurality of external magnetic fields. Typically, each of the plurality of magnetic field generation units is formed of a permanent magnet. The plurality of magnetic field generation units are magnetized in alternating directions. This causes the external magnetic fields generated by the plurality of magnetic field generation units to be in alternating directions.

Some magnetic sensors have means for applying a bias magnetic field to the magnetic detection element. The bias magnetic field is used to allow the magnetic detection element to respond linearly to a variation in the strength of the target magnetic field. In a magnetic sensor that uses a spin-valve MR element, the bias magnetic field is used also to make the free layer have a single magnetic domain and to orient the magnetization of the free layer in a certain direction, when there is no target magnetic field.

U.S. Patent Application Publication No. 2014/0292322 A1 discloses a magnetic sensor including a bias magnetic field generator for generating a plurality of bias magnetic fields to be applied to a plurality of MR elements. The bias magnetic field generator includes a plurality of pairs of magnetic field generation units provided in correspondence with the plurality of MR elements. Every two magnetic field generation units pairing up with each other are arranged with a corresponding one of the MR elements in between. Each magnetic field generation unit is formed of a permanent magnet and generates an external magnetic field.

A structure including a plurality of magnetic field generation units arranged in a predetermined pattern to generate a plurality of external magnetic fields, such as a scale, will hereinafter be referred to as magnetic field generator. In a magnetic sensor including a bias magnetic field generator, a plurality of magnetic field generation units constituting the bias magnetic field generator are arranged in a predetermined pattern. Thus, the bias magnetic field generator can also be said to be a magnetic field generator.

Magnetic sensor systems and magnetic sensors each including a magnetic field generator that includes a plurality of magnetic field generation units each formed of a permanent magnet suffer from the following problem. Such magnetic sensor systems and magnetic sensors are typically used under the condition that the strength of the target magnetic field does not exceed the coercivity of the permanent magnets. However, since the magnetic sensor systems and the magnetic sensors can be used in various environments, an external magnetic field having a strength exceeding the coercivity of the permanent magnets can happen to be temporarily applied to the permanent magnets. When such an external magnetic field is temporarily applied to the permanent magnets, the magnetization direction of the permanent magnets may be changed from an original direction and then remain different from the original direction even after the external magnetic field disappears. In such a case, the direction of the magnetic field generated by each magnetic field generation unit changes to become different from a desired direction.

Further, the magnetic field generator including a plurality of magnetic field generation units each formed of a permanent magnet has a problem in that the plurality of magnetic field generation units are difficult to arrange in a desired pattern. This problem will be described in detail below by taking as an example a magnetic field generator in which the plurality of magnetic field generation units are magnetized in alternating directions, such as a scale. The following description assumes that the magnetization directions of the plurality of magnetic field generation units alternate between a first direction and a second direction. A plurality of magnetic field generation units magnetized in the first direction will be referred to as a plurality of first magnetic field generation units. A plurality of magnetic field generation units magnetized in the second direction will be referred to as a plurality of second magnetic field generation units. This magnetic field generator is fabricated by the following method.

First, an initial magnetic field generator including a plurality of initial magnetic field generation units that are not magnetized in a predetermined direction is fabricated. Next, a plurality of ones of the initial magnetic field generation units that are intended to become a plurality of first magnetic field generation units are subjected to a magnetic field in the first direction having a higher strength than the coercivity of those plurality of ones of the initial magnetic field generation units, whereby those plurality of ones of the initial magnetic field generation units are magnetized in the first direction. At this time, the other plurality of ones of the initial magnetic field generation units that are intended to become a plurality of second magnetic field generation units are not subjected to any magnetic field having a higher strength than the coercivity of those initial magnetic field generation units. The initial magnetic field generation units magnetized in the first direction become the plurality of first magnetic field generation units.

Next, the initial magnetic field generation units intended to become the plurality of second magnetic field generation units are subjected to a magnetic field in the second direction having a higher strength than the coercivity of those initial magnetic field generation units, whereby those initial magnetic field generation units are magnetized in the second direction. At this time, the plurality of first magnetic field generation units, which have already been magnetized in the first direction, are not subjected to any magnetic field having a higher strength than the coercivity thereof. The initial magnetic field generation units magnetized in the second direction become the plurality of second magnetic field generation units.

The foregoing fabrication method for the magnetic field generator requires that the magnetic fields to be applied have strengths largely different between two adjacent initial magnetic field generation units or between one of the first magnetic field generation units and one of the initial magnetic field generation units adjacent each other. To achieve this, measures such as an increase in the distance between the two adjacent magnetic field generation units are required. Thus, in the magnetic field generator including a plurality of magnetic field generation units each formed of a permanent magnet, the plurality of magnetic field generation units are difficult to arrange in a desired pattern.

An increase in the distance between two adjacent magnetic field generation units results in a reduction in flexibility in the arrangement of the plurality of magnetic field generation units and an increase in the area occupied by the plurality of magnetic field generation units. Furthermore, the difference of the external magnetic fields is dull between the two adjacent magnetic field generation units, thus causing a reduction in the resolution of the magnetic sensor system using the magnetic field generator as the scale.

OBJECT AND SUMMARY OF THE INVENTION

It is an object of the present invention to provide a magnetic field generator that includes a plurality of magnetic field generation units arranged in a desired pattern and that has high immunity to disturbance magnetic fields, and to provide a magnetic sensor system and a magnetic sensor each including the magnetic field generator.

A magnetic field generator of the present invention includes a plurality of magnetic field generation units arranged in a predetermined pattern to generate a plurality of external magnetic fields. Each of the plurality of magnetic field generation units includes a first ferromagnetic material section and a first antiferromagnetic material section. The first antiferromagnetic material section is in contact with and exchange-coupled to the first ferromagnetic material section. The first ferromagnetic material section has its overall magnetization. The plurality of magnetic field generation units include two magnetic field generation units configured so that the overall magnetizations of their respective first ferromagnetic material sections are in different directions from each other.

In the magnetic field generator of the present invention, the first ferromagnetic material section may include a plurality of constituent layers stacked on each other. In this case, the plurality of constituent layers include a first ferromagnetic layer in contact with the first antiferromagnetic material section. The plurality of constituent layers may further include a second ferromagnetic layer which is located farther from the first antiferromagnetic material section than is the first ferromagnetic layer. The plurality of constituent layers may further include a nonmagnetic layer interposed between the first ferromagnetic layer and the second ferromagnetic layer. The first ferromagnetic layer and the second ferromagnetic layer may be ferromagnetically exchange-coupled to each other via the nonmagnetic layer. In this case, each of the first ferromagnetic layer and the second ferromagnetic layer has a magnetization in the same direction as the overall magnetization of the first ferromagnetic material section. Alternatively, the first ferromagnetic layer and the second ferromagnetic layer may be antiferromagnetically exchange-coupled to each other via the nonmagnetic layer. In this case, the second ferromagnetic layer has a magnetization in the same direction as the overall magnetization of the first ferromagnetic material section.

In the magnetic field generator of the present invention, the first ferromagnetic material section may have a first surface and a second surface opposite to each other. The first antiferromagnetic material section may be in contact with the first surface of the first ferromagnetic material section. In this case, each of the plurality of magnetic field generation units may further include a second antiferromagnetic material section in contact with the second surface of the first ferromagnetic material section and exchange-coupled to the first ferromagnetic material section. The first and second antiferromagnetic material sections may have different blocking temperatures.

In the magnetic field generator of the present invention, the first antiferromagnetic material section may have a first surface and a second surface opposite to each other. The first ferromagnetic material section may be in contact with the first surface of the first antiferromagnetic material section. In this case, each of the plurality of magnetic field generation units may further include a second ferromagnetic material section in contact with the second surface of the first antiferromagnetic material section and exchange-coupled to the first antiferromagnetic material section. The second ferromagnetic material section has its overall magnetization.

A magnetic sensor system of the present invention includes a scale and a magnetic sensor arranged in a variable relative positional relationship with each other, and is configured to detect a physical quantity associated with the relative positional relationship between the scale and the magnetic sensor. The scale is formed of the magnetic field generator of the present invention.

In the magnetic sensor system of the present invention, the plurality of magnetic field generation units may be arranged in a row. In this case, any two adjacent ones of the plurality of magnetic field generation units may be configured so that the overall magnetizations of their respective first ferromagnetic material sections are in different directions from each other. The direction of the overall magnetization of the first ferromagnetic material section of one of the two adjacent magnetic field generation units and the direction of the overall magnetization of the first ferromagnetic material section of the other of the two adjacent magnetic field generation units may intersect a direction in which the row of the plurality of magnetic field generation units extends and may be opposite to each other.

In the magnetic sensor system of the present invention, the plurality of magnetic field generation units may be annularly arranged to form an aggregation having an outer periphery and an inner periphery. In this case, any two adjacent ones of the plurality of magnetic field generation units may be configured so that the overall magnetizations of their respective first ferromagnetic material sections are in different directions from each other. The overall magnetization of the first ferromagnetic material section of one of the two adjacent magnetic field generation units may be in a direction from the outer periphery to the inner periphery, and the overall magnetization of the first ferromagnetic material section of the other of the two adjacent magnetic field generation units may be in a direction from the inner periphery to the outer periphery.

A magnetic sensor of the present invention includes a plurality of magnetic detection elements for detecting a target magnetic field, and a bias magnetic field generator for generating a plurality of bias magnetic fields to be applied to the plurality of magnetic detection elements. The bias magnetic field generator is formed of the magnetic field generator of the present invention. Each of the plurality of bias magnetic fields results from the overall magnetization of the first ferromagnetic material section of at least one of the plurality of magnetic field generation units.

In the magnetic sensor of the present invention, each of the plurality of magnetic detection elements may be a magnetoresistance element. The magnetoresistance element may include a magnetization pinned layer having a magnetization pinned in a certain direction, a free layer having a magnetization that varies depending on the target magnetic field, and a nonmagnetic layer located between the magnetization pinned layer and the free layer. The overall magnetization of the first ferromagnetic material section of any one of the plurality of magnetic field generation units may be in a direction intersecting the direction of the magnetization of the magnetization pinned layer of a specific magnetoresistance element that is to be subjected to a bias magnetic field resulting from the overall magnetization of the first ferromagnetic material section of the one of the plurality of magnetic field generation units.

In the magnetic sensor of the present invention, the plurality of magnetic detection elements may include a first magnetic detection element and a second magnetic detection element connected in series. The plurality of magnetic field generation units may include a first magnetic field generation unit and a second magnetic field generation unit. A bias magnetic field to be applied to the first magnetic detection element results from the overall magnetization of the first ferromagnetic material section of the first magnetic field generation unit. A bias magnetic field to be applied to the second magnetic detection element results from the overall magnetization of the first ferromagnetic material section of the second magnetic field generation unit. The first and second magnetic field generation units are configured so that the overall magnetizations of their respective first ferromagnetic material sections are in different directions from each other.

In the magnetic sensor of the present invention, the plurality of magnetic detection elements may include a first magnetic detection element and a second magnetic detection element connected in series. The plurality of magnetic field generation units may include a first to a fourth magnetic field generation unit. A bias magnetic field to be applied to the first magnetic detection element results from the overall magnetization of the first ferromagnetic material section of the first magnetic field generation unit and the overall magnetization of the first ferromagnetic material section of the second magnetic field generation unit. A bias magnetic field to be applied to the second magnetic detection element results from the overall magnetization of the first ferromagnetic material section of the third magnetic field generation unit and the overall magnetization of the first ferromagnetic material section of the fourth magnetic field generation unit. The first and third magnetic field generation units are adjacent to each other and configured so that the overall magnetizations of their respective first ferromagnetic material sections are in different directions from each other. The second and fourth magnetic field generation units are adjacent to each other and configured so that the overall magnetizations of their respective first ferromagnetic material sections are in different directions from each other.

In each of the magnetic field generation units in the magnetic field generator of the present invention, the direction of the overall magnetization of the first ferromagnetic material section is defined by exchange coupling between the first antiferromagnetic material section and the first ferromagnetic material section. In each magnetic field generation unit, even if a disturbance magnetic field having a high strength sufficient to reverse the direction of the overall magnetization of the first ferromagnetic material section is temporarily applied, the direction of the overall magnetization of the first ferromagnetic material section returns to an original direction upon disappearance of such a disturbance magnetic field. Further, the magnetic field generator of the present invention can be easily fabricated without the need for increasing the distance between two adjacent magnetic field generation units. The present invention thus makes it possible to provide a magnetic field generator that includes a plurality of magnetic field generation units arranged in a desired pattern and that has high immunity to disturbance magnetic fields, and to provide a magnetic sensor system and a magnetic sensor each including the magnetic field generator.

Other and further objects, features and advantages of the present invention will appear more fully from the following description.

DETAILED DESCRIPTION OF THE PREFERRED EMBODIMENTS

First Embodiment

Figure 1:
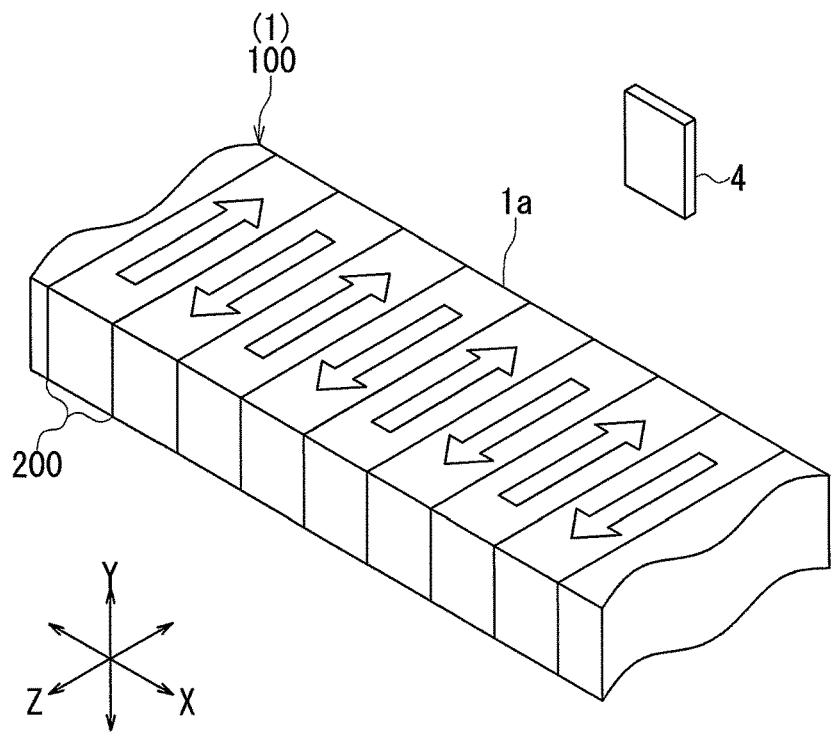
FIG. 1 is a perspective view illustrating the general configuration of a magnetic sensor system according to a first embodiment of the invention.

Preferred embodiments of the present invention will now be described in detail with reference to the drawings. First, reference is made to FIG. 1 to describe the general configuration of a magnetic sensor system according to a first embodiment of the invention. The magnetic sensor system according to the first embodiment includes a scale 1 and a magnetic sensor 4 arranged in a variable relative positional relationship with each other. The magnetic sensor system is configured to detect a physical quantity associated with the relative positional relationship between the scale 1 and the magnetic sensor 4. The scale 1 of the first embodiment is a linear scale formed of a magnetic field generator 100 according to the first embodiment. The magnetic field generator 100 includes a plurality of magnetic field generation units 200 arranged in a predetermined pattern to generate a plurality of external magnetic fields. In the first embodiment, the plurality of magnetic field generation units 200 are arranged in a row.

In the first embodiment, the direction in which the row of the plurality of magnetic field generation units 200 extends is denoted as the X direction. Two directions perpendicular to the X direction and perpendicular to each other are denoted as the Y direction and the Z direction. As used herein, each of the X, Y and Z directions is defined as including one particular direction and the opposite direction thereto, as indicated by the respective double-headed arrows in FIG. 1. On the other hand, the direction of any magnetic field or magnetization is defined as indicating a single particular direction.

Each of the plurality of magnetic field generation units 200 is shaped like a rectangular solid, for example. The plurality of magnetic field generation units 200 have equal or nearly equal widths in the X direction. The scale 1 has a side surface 1a perpendicular to the Z direction. The magnetic sensor 4 is placed to face the side surface 1a of the scale 1. One of the scale 1 and the magnetic sensor 4 moves linearly in the X direction in response to the movement of a moving object (not illustrated). This causes a change in the relative positional relationship between the scale 1 and the magnetic sensor 4. The magnetic sensor system detects, as the physical quantity associated with the relative positional relationship between the scale 1 and the magnetic sensor 4, the relative position and/or speed of the scale 1 with respect to the magnetic sensor 4.

A change in the relative positional relationship between the scale 1 and the magnetic sensor 4 causes a change in the direction of the target magnetic field for the magnetic sensor 4, that is, a magnetic field to be applied to the magnetic sensor 4 on the basis of part of the plurality of external magnetic fields generated by the plurality of magnetic field generation units 200. In the example shown in FIG. 1, an X-directional orthogonal projection component of the target magnetic field vibrates at the location of the magnetic sensor 4.

Figure 2:
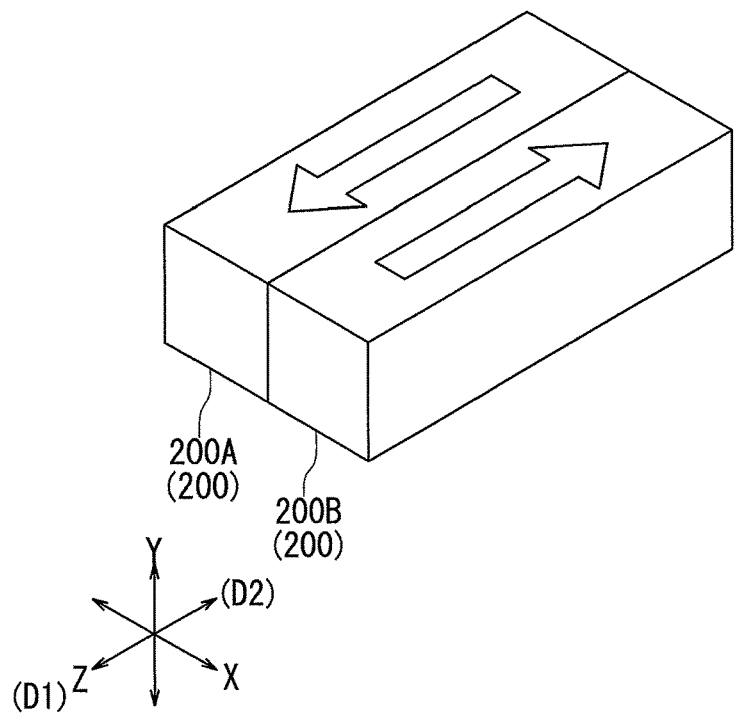
FIG. 2 is a perspective view of a part of a magnetic field generator according to the first embodiment of the invention.
Figure 3:
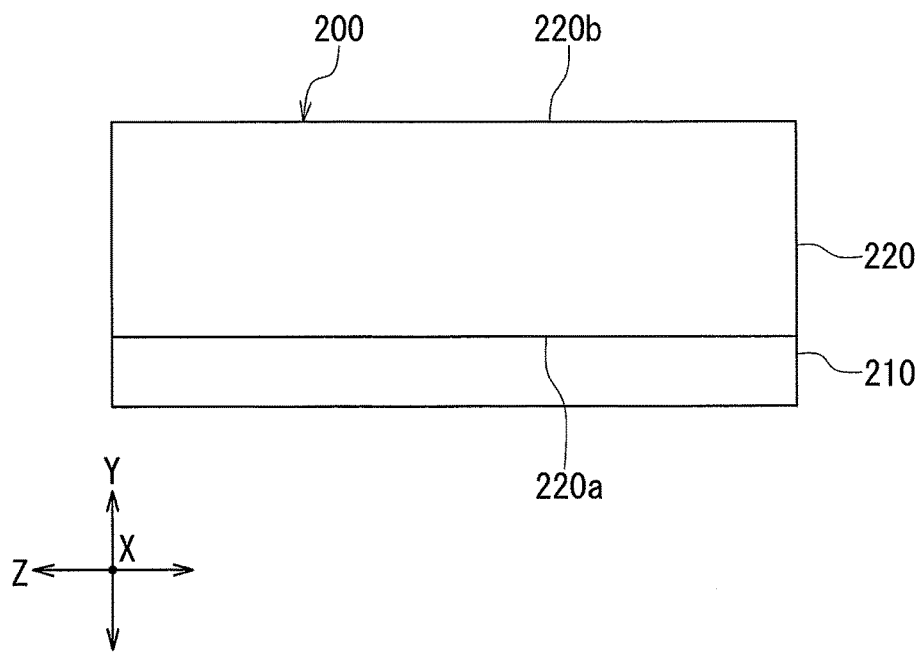
FIG. 3 is a side view illustrating a first example of a magnetic field generation unit of the first embodiment of the invention.

The configuration of the plurality of magnetic field generation units 200 will now be described with reference to FIG. 1 to FIG. 3. FIG. 2 is a perspective view of a part of the magnetic field generator 100. FIG. 3 is a side view illustrating a first example of a magnetic field generation unit 200. As shown in FIG. 3, each of the plurality of magnetic field generation units 200 includes a first ferromagnetic material section 220 and a first antiferromagnetic material section 210. In the first embodiment, the first ferromagnetic material section 220 and the first antiferromagnetic material section 210 are stacked along the Y direction. The first ferromagnetic material section 220 has a first surface 220a and a second surface 220b opposite to each other. The first antiferromagnetic material section 210 is in contact with the first surface 220a of the first ferromagnetic material section 220 and exchange-coupled to the first ferromagnetic material section 220.

The first ferromagnetic material section 220 has its overall magnetization. The overall magnetization of the first ferromagnetic material section 220 refers to the volume average of the vector sum of magnetic moments in units of atoms, crystal lattices, or the like in the entire first ferromagnetic material section 220. Hereinafter, the overall magnetization of the first ferromagnetic material section 220 will simply be referred to as the magnetization of the first ferromagnetic material section 220. Each of the hollow arrows in FIG. 1 and FIG. 2 indicates the direction of the magnetization of the first ferromagnetic material section 220.

In the magnetic field generator 100 according to the first embodiment, the direction of the magnetization of the first ferromagnetic material section 220 is defined by exchange coupling between the first antiferromagnetic material section 210 and the first ferromagnetic material section 220. The magnetic field generator 100 has high immunity to disturbance magnetic fields. This will be described in detail later.

The plurality of magnetic field generation units 200 include two magnetic field generation units configured so that the magnetizations of their respective first ferromagnetic material sections 220 are in different directions from each other. In FIG. 2, reference symbols 200A and 200B represent any two adjacent ones of the plurality of magnetic field generation units 200. As shown in FIG. 2, the two magnetic field generation units 200A and 200B are configured so that the magnetizations of their respective first ferromagnetic material sections 220 are in different directions from each other. In the first embodiment, in particular, the direction of the magnetization of the first ferromagnetic material section 220 of the magnetic field generation unit 200A and the direction of the magnetization of the first ferromagnetic material section 220 of the magnetic field generation unit 200B intersect the X direction, i.e., the direction in which the row of the plurality of magnetic field generation units 200 extend, and are opposite to each other.

Now, a first direction D1 and a second direction D2 will be defined as shown in FIG. 2. In the first embodiment, each of the first and second directions D1 and D2 is one particular direction parallel to the Z direction. In FIG. 2, the first direction D1 is toward the lower left. The second direction D2 is opposite to the first direction D1. In the example shown in FIG. 2, the magnetization of the first ferromagnetic material section 220 of the magnetic field generation unit 200A is in the first direction D1. The magnetization of the first ferromagnetic material section 220 of the magnetic field generation unit 200B is in the second direction D2.

The first ferromagnetic material section 220 may be constituted by a single ferromagnetic layer or may include a plurality of constituent layers stacked on each other. The first example of the magnetic field generation unit 200 shown in FIG. 3 is where the first ferromagnetic material section 220 is constituted by a single ferromagnetic layer. In the first example, the first ferromagnetic material section 220, a ferromagnetic layer, is formed of a ferromagnetic material containing one or more elements selected from the group consisting of Co, Fe, and Ni. Examples of such a ferromagnetic material include CoFe, CoFeB, and CoNiFe. The first antiferromagnetic material section 210 is formed of an antiferromagnetic material such as IrMn or PtMn.

Second to eighth examples of the magnetic field generation units 200 will now be described with reference to FIG. 4 to FIG. 9. Each of the second to eighth examples is where the first ferromagnetic material section 220 includes a plurality of constituent layers stacked on each other.

Figure 4:
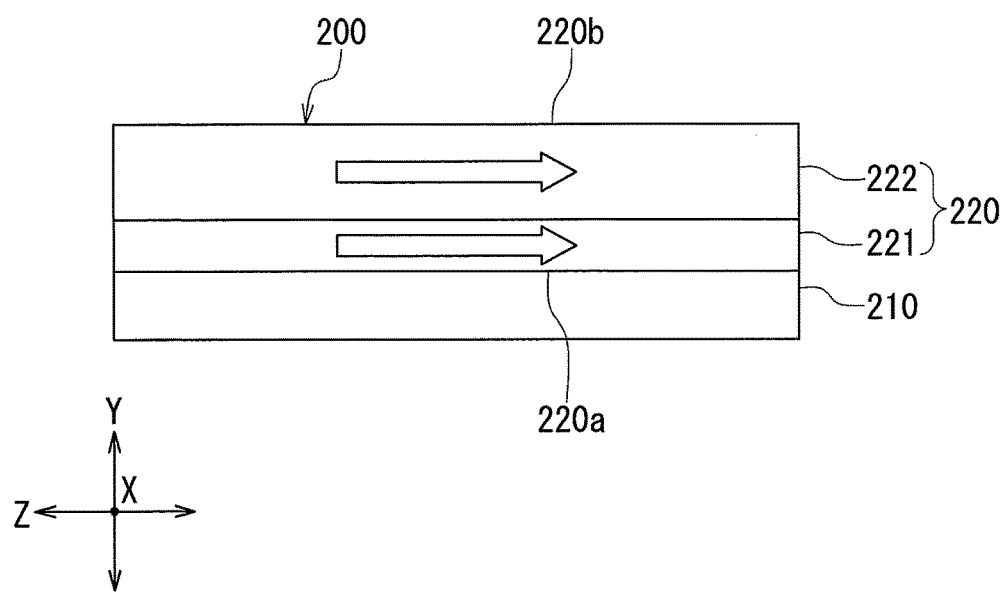
FIG. 4 is a side view illustrating a second example of the magnetic field generation unit of the first embodiment of the invention.

FIG. 4 shows the second example of the magnetic field generation unit 200. In the second example, the plurality of constituent layers of the first ferromagnetic material section 220 include a first ferromagnetic layer 221 in contact with the first antiferromagnetic material section 210, and a second ferromagnetic layer 222 located farther from the first antiferromagnetic material section 210 than the first ferromagnetic layer 221. Each of the first and second ferromagnetic layers 221 and 222 has a magnetization in the same direction as the magnetization of the first ferromagnetic material section 220. In FIG. 4, the hollow arrows in the first and second ferromagnetic layers 221 and 222 indicate the direction of the magnetizations of the first and second ferromagnetic layers 221 and 222. In any figures that are similar to FIG. 4 and are to be referred to for descriptions below, the directions of magnetizations of ferromagnetic layers such as the first and second ferromagnetic layers 221 and 222 will be illustrated in the same manner as in FIG. 4.

To enhance the external magnetic fields to be generated by the magnetic field generation units 200 and miniaturize the magnetic field generation units 200, the first ferromagnetic material section 220 preferably includes a ferromagnetic layer formed of a ferromagnetic material having a high saturation magnetic flux density. However, such a ferromagnetic layer does not always provide high exchange coupling energy between itself and the first antiferromagnetic material section 210. Thus, in the second example, the first ferromagnetic layer 221 is preferably formed of a ferromagnetic material that can increase exchange coupling energy between the first ferromagnetic layer 221 and the first antiferromagnetic material section 210, and the second ferromagnetic layer 222 is preferably formed of a ferromagnetic material that has a higher saturation magnetic flux density than the ferromagnetic material used to form the first ferromagnetic layer 221. This makes it possible to enhance the external magnetic fields to be generated by the magnetic field generation units 200 and miniaturize the magnetic field generation units 200, while increasing the exchange coupling energy between the first ferromagnetic material section 220 and the first antiferromagnetic material section 210. Examples of the first ferromagnetic layer 221 include a CoFe layer. Examples of the second ferromagnetic layer 222 include an Fe layer.

Figure 5:
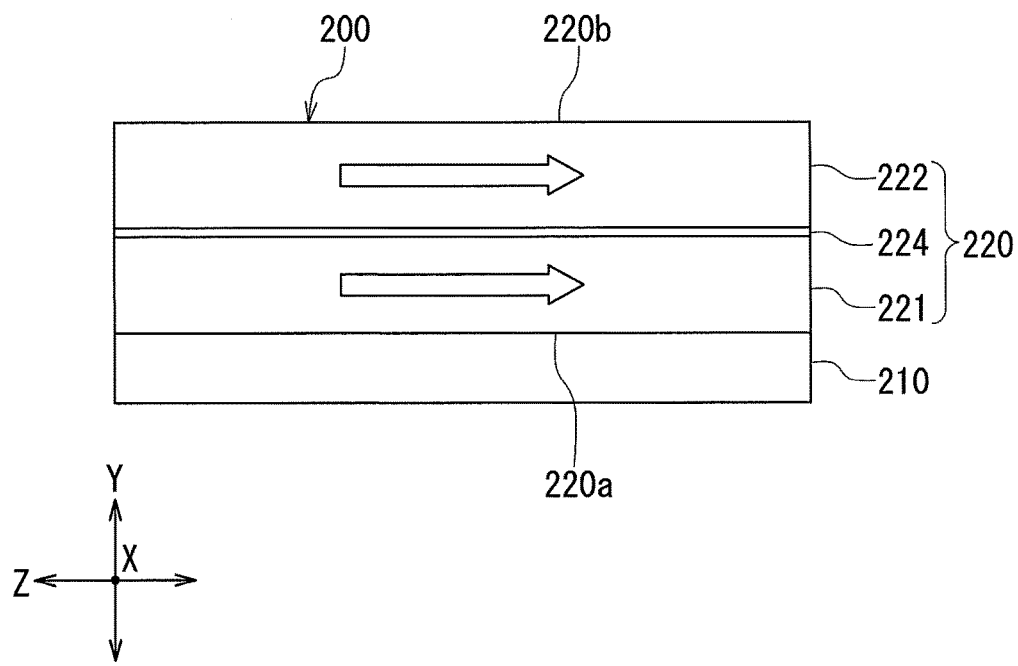
FIG. 5 is a side view illustrating a third example of the magnetic field generation unit of the first embodiment of the invention.

FIG. 5 shows the third example of the magnetic field generation unit 200. In the third example, the plurality of constituent layers of the first ferromagnetic material section 220 include the first and second ferromagnetic layers 221 and 222, as in the second example. The first and second ferromagnetic layers 221 and 222 may be formed of the same ferromagnetic material or different ferromagnetic materials.

The plurality of constituent layers in the third example further include a nonmagnetic layer 224 located between the first and second ferromagnetic layers 221 and 222. The nonmagnetic layer 224 may be formed of Ru, for example. In the third example, the first and second ferromagnetic layers 221 and 222 are ferromagnetically exchange-coupled to each other via the nonmagnetic layer 224 so that the first and second ferromagnetic layers 221 and 222 have magnetizations in the same direction. The direction of the magnetizations of the first and second ferromagnetic layers 221 and 222 is the same as the direction of the magnetization of the first ferromagnetic material section 220. The nonmagnetic layer 224 has a thickness sufficient to maintain the exchange coupling between the first and second ferromagnetic layers 221 and 222.

Figure 6:
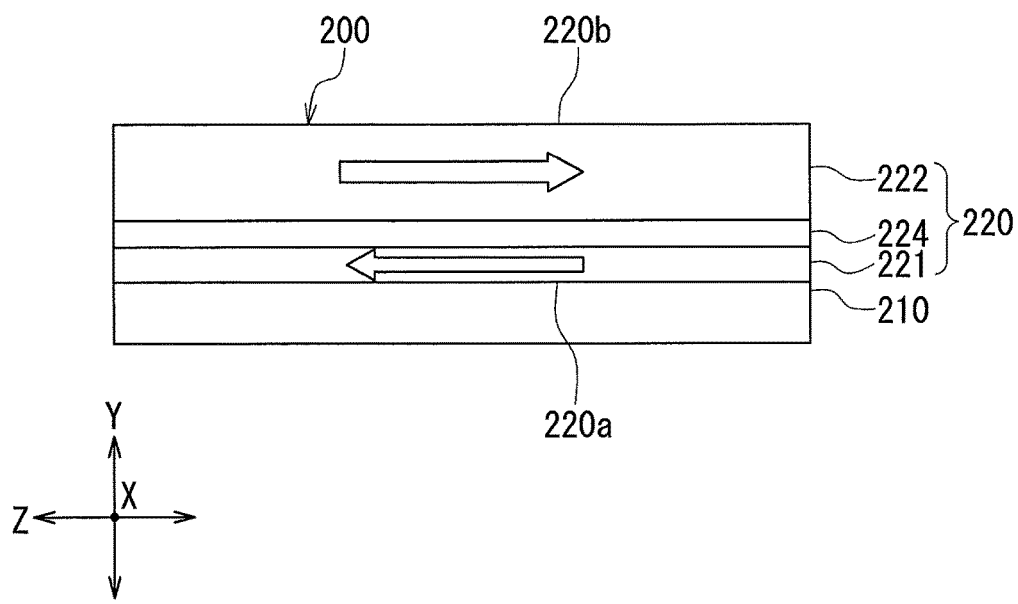
FIG. 6 is a side view illustrating a fourth example of the magnetic field generation unit of the first embodiment of the invention.

FIG. 6 shows the fourth example of the magnetic field generation unit 200. In the fourth example, the constituent layers of the first ferromagnetic material section 220 include the first ferromagnetic layer 221, the second ferromagnetic layer 222 and the nonmagnetic layer 224, as in the third example. In the fourth example, the first and second ferromagnetic layers 221 and 222 are antiferromagnetically exchange-coupled to each other via the nonmagnetic layer 224 so that the first and second ferromagnetic layers 221 and 222 have magnetizations in mutually opposite directions. The magnetization of the first ferromagnetic layer 221 is in the opposite direction to the magnetization of the first ferromagnetic material section 220, whereas the magnetization of the second ferromagnetic layer 222 is in the same direction as the magnetization of the first ferromagnetic material section 220.

In the fourth example, the sum total of magnetic moments on a unit basis in the entire second ferromagnetic layer 222 is higher than the sum total of magnetic moments on a unit basis in the entire first ferromagnetic layer 221. Thus, in the fourth example, the magnetization of the first ferromagnetic material section 220 is in the same direction as the magnetization of the second ferromagnetic layer 222.

Examples of the first ferromagnetic layer 221 include a $Co_{90}Fe_{10}$ layer. Examples of the second ferromagnetic layer 222 include a $Co_{30}Fe_{70}$ layer. $Co_{90}Fe_{10}$ represents an alloy composed of 90 atomic percent Co and 10 atomic percent Fe. $Co_{30}Fe_{70}$ represents an alloy composed of 30 atomic percent Co and 70 atomic percent Fe. The second ferromagnetic layer 222 preferably has a greater thickness than the first ferromagnetic layer 221.

In the fourth example, the exchange coupling energy between the first ferromagnetic layer 221 and the second ferromagnetic layer 222, which are antiferromagnetically coupled to each other, can sometimes be higher than the exchange coupling energy between the first antiferromagnetic material section 210 and the first ferromagnetic layer 221. In such a case, the magnetization fixing force of the second ferromagnetic layer 222 is enhanced, and consequently the magnetic field generator 100 has enhanced immunity to disturbance magnetic fields.

Figure 7:
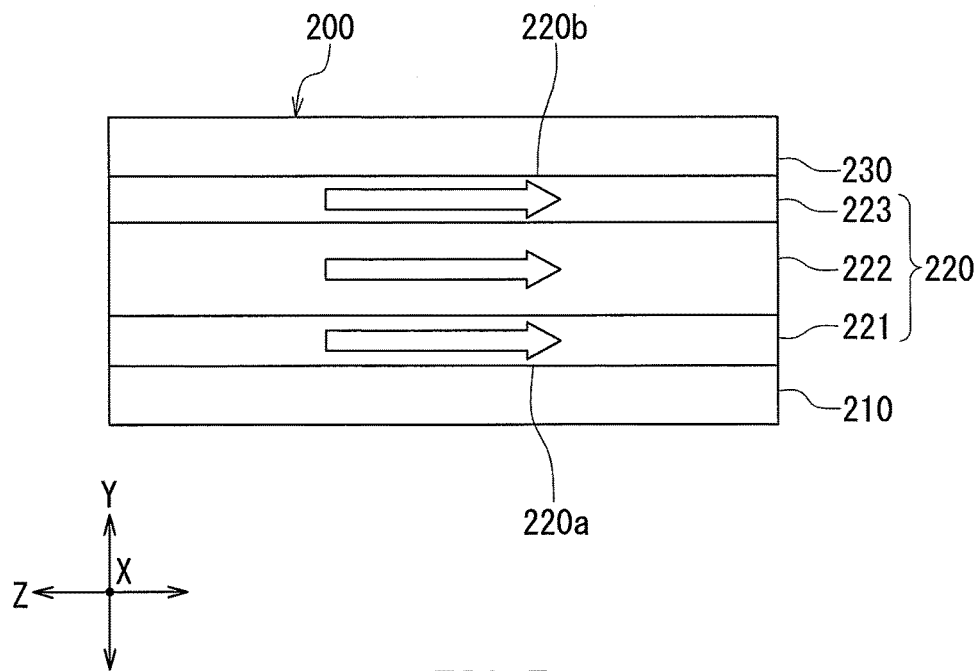
FIG. 7 is a side view illustrating a fifth example of the magnetic field generation unit of the first embodiment of the invention.

FIG. 7 shows the fifth example of the magnetic field generation unit 200. In the fifth example, each of the plurality of magnetic field generation units 200 includes a second antiferromagnetic material section 230 in addition to the first ferromagnetic material section 220 and the first antiferromagnetic material section 210. The second antiferromagnetic material section 230 is in contact with the second surface 220b of the first ferromagnetic material section 220 and exchange-coupled to the first ferromagnetic material section 220. The second antiferromagnetic material section 230 is formed of, for example, the same antiferromagnetic material as the first antiferromagnetic material section 210 in the first example. In the fifth example, in particular, the first antiferromagnetic material section 210 and the second antiferromagnetic material section 230 are formed of the same antiferromagnetic material.

In the fifth example, the plurality of constituent layers of the first ferromagnetic material section 220 include the first and second ferromagnetic layers 221 and 222, as in the second example. The plurality of constituent layers in the fifth example further include a third ferromagnetic layer 223 located farther from the first antiferromagnetic material section 210 than the first and second ferromagnetic layers 221 and 222 and in contact with the second antiferromagnetic material section 230. The first ferromagnetic layer 221, the second ferromagnetic layer 222 and the third ferromagnetic layer 223 have magnetizations in the same direction as the magnetization of the first ferromagnetic material section 220. In the fifth example, the first and third ferromagnetic layers 221 and 223 are preferably formed of a ferromagnetic material that can increase exchange coupling energy between the first ferromagnetic layer 221 and the first antiferromagnetic material section 210 and between the third ferromagnetic layer 223 and the second antiferromagnetic material section 230, and the second ferromagnetic layer 222 is preferably formed of a ferromagnetic material that has a higher saturation magnetic flux density than the ferromagnetic material used to form the first and third ferromagnetic layers 221 and 223. Examples of the first and third ferromagnetic layers 221 and 223 include a CoFe layer. Examples of the second ferromagnetic layer 222 include an Fe layer.

The direction of the magnetization of the first ferromagnetic material section 220 is defined by exchange coupling of the first ferromagnetic material section 220 with the first and second antiferromagnetic material sections 210 and 230. The fifth example allows the magnetization fixing force of the first ferromagnetic material section 220 to be higher, and consequently allows the magnetic field generator 100 to have higher immunity to disturbance magnetic fields, when compared with a case where each magnetic field generation unit 200 includes only the first antiferromagnetic material section 210 and the first ferromagnetic material section 220.

In the fifth example, the first ferromagnetic material section 220 in the first example shown in FIG. 3 may be used instead of the first ferromagnetic material section 220 shown in FIG. 7. In such a case also, the direction of the magnetization of the first ferromagnetic material section 220 is defined by exchange coupling of the first ferromagnetic material section 220 with the first and second antiferromagnetic material sections 210 and 230.

Next, the sixth example of the magnetic field generation unit 200 will be described. The magnetic field generation unit 200 in the sixth example has basically the same configuration as the magnetic field generation unit 200 in the fifth example shown in FIG. 7. In the sixth example, however, the first antiferromagnetic material section 210 and the second antiferromagnetic material section 230 have different blocking temperatures.

The operation and effect of the sixth example will now be described. By way of example, a description will be given of a case where the first antiferromagnetic material section 210 is an IrMn layer, the second antiferromagnetic material section 230 is a PtMn layer, and each of the first and third ferromagnetic layers 221 and 223 is a CoFe layer. In this case, the coupling force between the first antiferromagnetic material section 210 and the first ferromagnetic layer 221 is higher than the coupling force between the second antiferromagnetic material section 230 and the third ferromagnetic layer 223. On the other hand, the second antiferromagnetic material section 230 (PtMn layer) has a higher blocking temperature than the first antiferromagnetic material section 210 (IrMn layer). In this case, when the temperature of the magnetic field generation unit 200 exceeds the blocking temperature of the first antiferromagnetic material section 210, the exchange coupling between the first antiferromagnetic material section 210 and the first ferromagnetic layer 221 disappears. However, if the temperature of the magnetic field generation unit 200 is less than the blocking temperature of the second antiferromagnetic material section 230, the exchange coupling between the second antiferromagnetic material section 230 and the third ferromagnetic layer 223 does not disappear, so that the magnetization of the first ferromagnetic material section 220 does not change direction. After that, when the temperature of the magnetic field generation unit 200 becomes lower than the blocking temperature of the first antiferromagnetic material section 210, the strong coupling between the first antiferromagnetic material section 210 and the first ferromagnetic layer 221 is reconstructed with the direction of the magnetization of the first ferromagnetic material section 220 maintained. The sixth example thus provides a magnetic field generator 100 in which the magnetizations of the first ferromagnetic material sections 220 are hard to change direction even when subjected to a high temperature.

Figure 8:
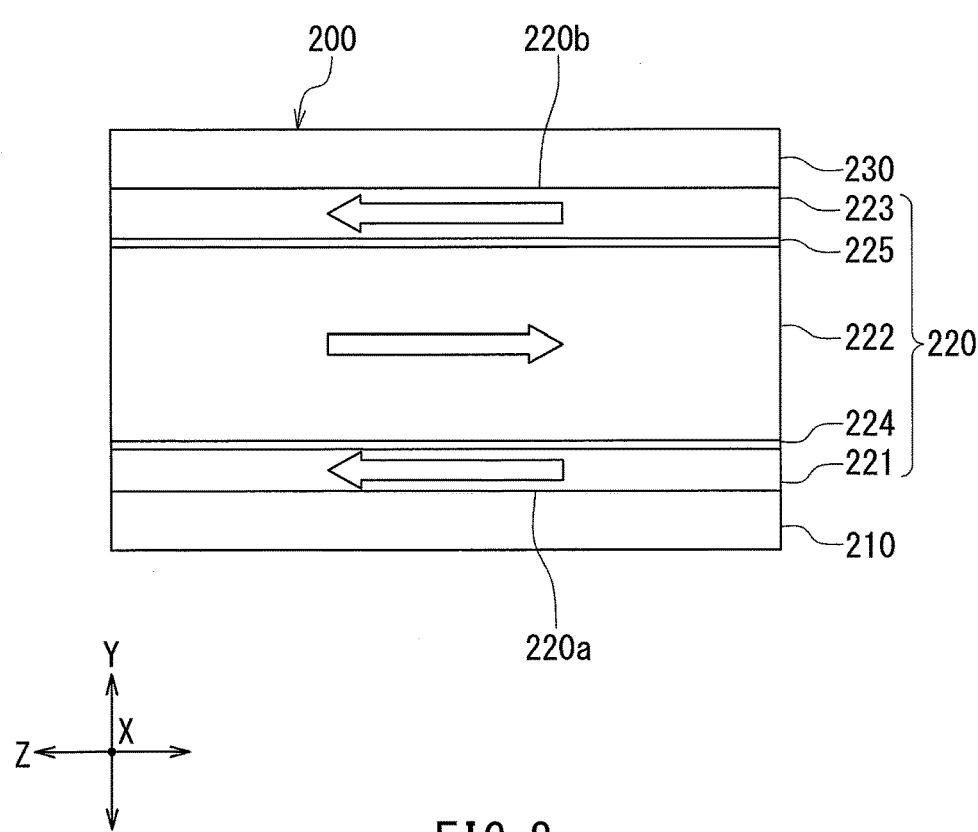
FIG. 8 is a side view illustrating a seventh example of the magnetic field generation unit of the first embodiment of the invention.

FIG. 8 shows the seventh example of the magnetic field generation unit 200. In the seventh example, each of the plurality of magnetic field generation units 200 includes the first ferromagnetic material section 220, the first antiferromagnetic material section 210 and the second antiferromagnetic material section 230, as in the fifth example. The constituent layers of the first ferromagnetic material section 220 include the first to third ferromagnetic layers 221, 222 and 223, as in the fifth example. The first to third ferromagnetic layers 221 to 223 may be formed of the same ferromagnetic material or ferromagnetic materials different from each other. Alternatively, two of the first to third ferromagnetic layers 221 to 223 may be formed of the same ferromagnetic material.

The constituent layers in the seventh example further include a nonmagnetic layer 224 interposed between the first ferromagnetic layer 221 and the second ferromagnetic layer 222, and a nonmagnetic layer 225 interposed between the second ferromagnetic layer 222 and the third ferromagnetic layer 223. The nonmagnetic layers 224 and 225 may be formed of Ru, for example. The first and second ferromagnetic layers 221 and 222 are antiferromagnetically exchange-coupled to each other via the nonmagnetic layer 224. The second and third ferromagnetic layers 222 and 223 are antiferromagnetically exchange-coupled to each other via the nonmagnetic layer 225. Each of the first and third ferromagnetic layers 221 and 223 has a magnetization in the opposite direction to the magnetization of the first ferromagnetic material section 220, whereas the second ferromagnetic layer 222 has a magnetization in the same direction as the magnetization of the first ferromagnetic material section 220.

In the seventh example, the sum total of magnetic moments on a unit basis in the entire second ferromagnetic layer 222 is higher than the sum total of magnetic moments on a unit basis in each of the entire first ferromagnetic layer 221 and the entire third ferromagnetic layer 223. Thus, in the seventh example, the magnetization of the first ferromagnetic material section 220 is in the same direction as the magnetization of the second ferromagnetic layer 222.

Figure 9:
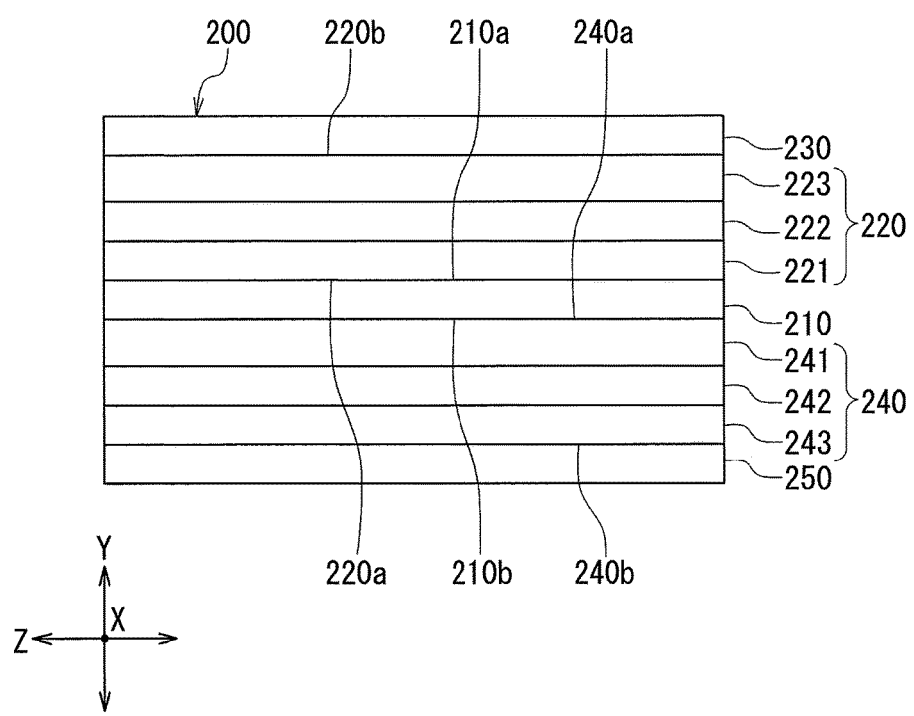
FIG. 9 is a side view illustrating an eighth example of the magnetic field generation unit of the first embodiment of the invention.

FIG. 9 shows the eighth example of the magnetic field generation unit 200. In the eighth example, each of the plurality of magnetic field generation units 200 includes the first ferromagnetic material section 220, the first antiferromagnetic material section 210 and the second antiferromagnetic material section 230, as in the fifth example. The constituent layers of the first ferromagnetic material section 220 include the first to third ferromagnetic layers 221, 222 and 223, as in the fifth example. The first to third ferromagnetic layers 221 to 223 may be formed of the same ferromagnetic material or ferromagnetic materials different from each other. Alternatively, two of the first to third ferromagnetic layers 221 to 223 may be formed of the same ferromagnetic material.

The first antiferromagnetic material section 210 has a first surface 210a and a second surface 210b opposite to each other. The first ferromagnetic material section 220 is in contact with the first surface 210a of the first antiferromagnetic material section 210. Each of the plurality of magnetic field generation units 200 in the eighth example further includes a second ferromagnetic material section 240 in contact with the second surface 210b of the first antiferromagnetic material section 210 and exchange-coupled to the first antiferromagnetic material section 210. The second ferromagnetic material section 240 has its overall magnetization. Hereinafter, the overall magnetization of the second ferromagnetic material section 240 will simply be referred to as the magnetization of the second ferromagnetic material section 240. The magnetization of the second ferromagnetic material section 240 is in the same direction as the magnetization of the first ferromagnetic material section 220.

The second ferromagnetic material section 240 has a first surface 240a and a second surface 240b opposite to each other. The first surface 240a of the second ferromagnetic material section 240 is in contact with the second surface 210b of the first antiferromagnetic material section 210. Each of the plurality of magnetic field generation units 200 in the eighth example further includes a third antiferromagnetic material section 250 in contact with the second surface 240b of the second ferromagnetic material section 240 and exchange-coupled to the second ferromagnetic material section 240. The first to third antiferromagnetic material sections 210, 230 and 250 may be formed of the same antiferromagnetic material or antiferromagnetic materials different from each other. Alternatively, two of the first to third antiferromagnetic material sections 210, 230 and 250 may be formed of the same antiferromagnetic material.

The second ferromagnetic material section 240 includes a plurality of constituent layers stacked on each other. The plurality of constituent layers include a first ferromagnetic layer 241, a second ferromagnetic layer 242 and a third ferromagnetic layer 243. The first ferromagnetic layer 241 is in contact with the first antiferromagnetic material section 210. The second ferromagnetic layer 242 is located farther from the first antiferromagnetic material section 210 than is the first ferromagnetic layer 241. The third ferromagnetic layer 243 is located farther from the first antiferromagnetic material section 210 than are the first and second ferromagnetic layers 241 and 242 and in contact with the third antiferromagnetic material section 250. The first to third ferromagnetic layers 241 to 243 may be formed of the same ferromagnetic material or ferromagnetic materials different from each other. Alternatively, two of the first to third ferromagnetic layers 241 to 243 may be formed of the same ferromagnetic material.

Each magnetic field generation unit 200 in the eighth example includes the two ferromagnetic material sections 220 and 240 having magnetizations in the same direction. The eighth example thus makes it possible to enhance the immunity of the magnetic field generator 100 to disturbance magnetic fields. Further, according to the eighth example, it is possible to set the magnetizations of the two ferromagnetic material sections 220 and 240 in the same direction by using the single antiferromagnetic material section 210. The eighth example thus allows for efficient fabrication of the two ferromagnetic material sections 220 and 240 having magnetizations in the same direction.

In the eighth example, the first ferromagnetic material section 220 shown in FIG. 9 may be replaced with the first ferromagnetic material section 220 of the first or seventh example shown in FIG. 3 or FIG. 8. Further, the second ferromagnetic material section 240 shown in FIG. 9 may be replaced with a ferromagnetic material section having the same configuration as the first ferromagnetic material section 220 of the first or seventh example shown in FIG. 3 or FIG. 8. Further, the magnetic field generation unit 200 of the first embodiment may be configured by omitting the second and third antiferromagnetic material sections 230 and 250 from the magnetic field generation unit 200 shown in FIG. 9.

Figure 10:
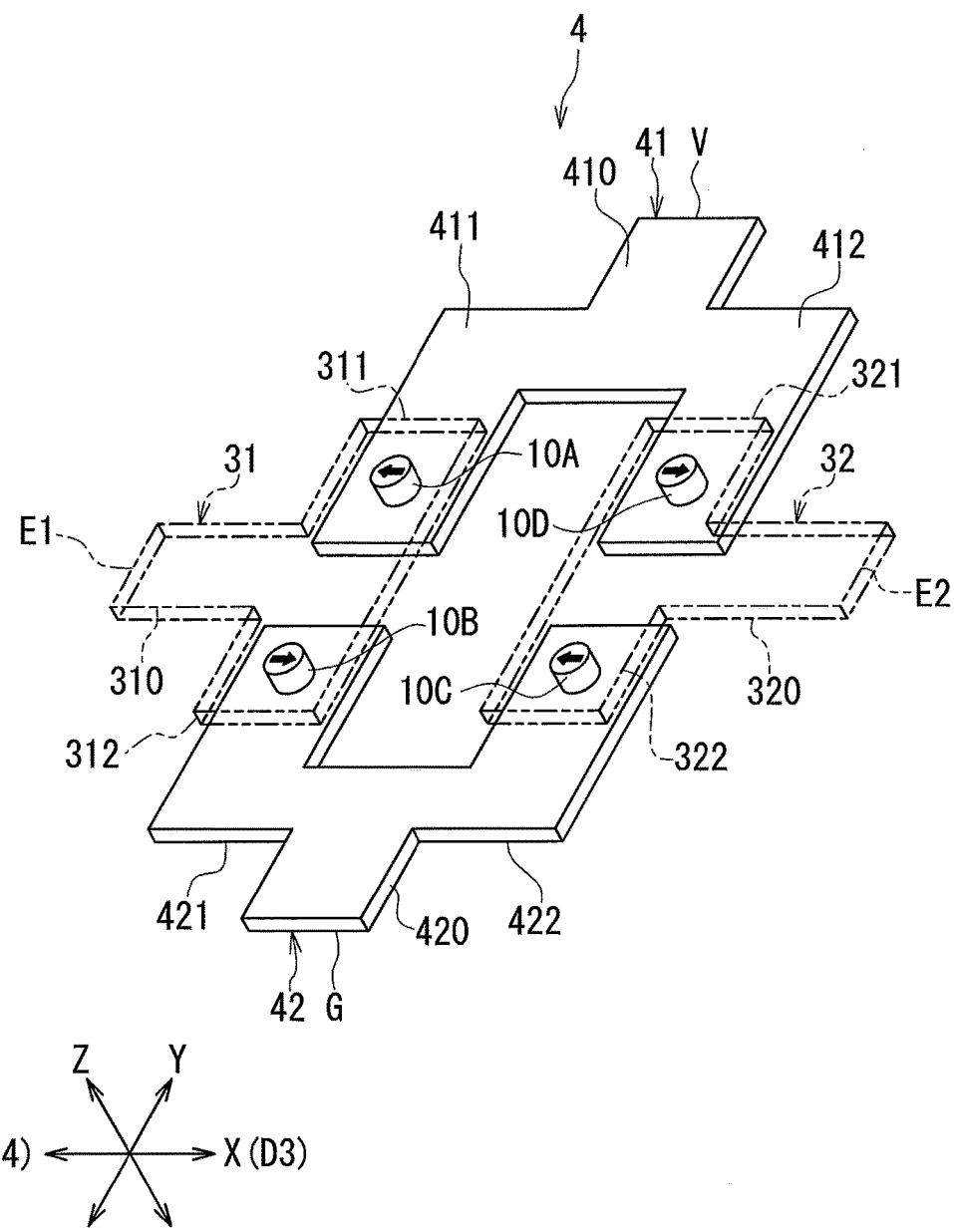
FIG. 10 is a perspective view of a magnetic sensor of the first embodiment of the invention.
Figure 11:
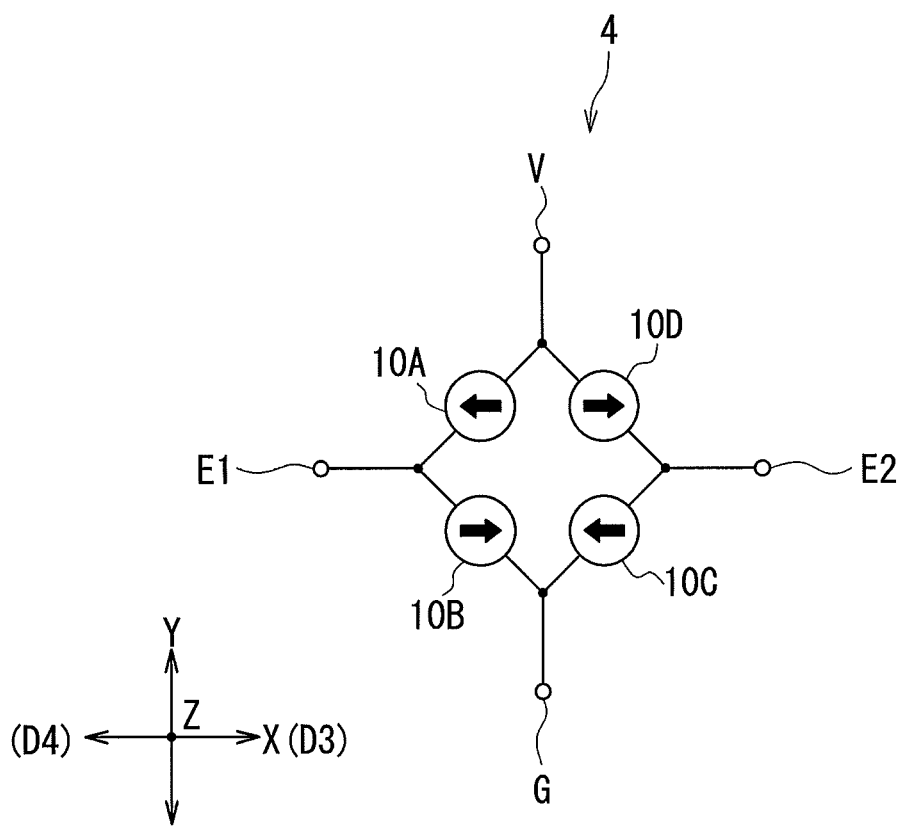
FIG. 11 is a circuit diagram of the magnetic sensor of the first embodiment of the invention.

An example of the configuration of the magnetic sensor 4 of the first embodiment will now be described with reference to FIG. 10 and FIG. 11. FIG. 10 is a perspective view of the magnetic sensor 4. FIG. 11 is a circuit diagram of the magnetic sensor 4. The magnetic sensor 4 includes four magnetoresistance (MR) elements 10A, 10B, 10C and 10D, a substrate (not illustrated), two upper electrodes 31 and 32, and two lower electrodes 41 and 42. The lower electrodes 41 and 42 are placed on the non-illustrated substrate.

The upper electrode 31 has a base part 310, and two branch parts 311 and 312 branching off from the base part 310. The upper electrode 32 has a base part 320, and two branch parts 321 and 322 branching off from the base part 320. The lower electrode 41 has a base part 410, and two branch parts 411 and 412 branching off from the base part 410. The lower electrode 42 has a base part 420, and two branch parts 421 and 422 branching off from the base parts 420. The branch part 311 of the upper electrode 31 is opposed to the branch part 411 of the lower electrode 41. The branch part 312 of the upper electrode 31 is opposed to the branch part 421 of the lower electrode 42. The branch part 321 of the upper electrode 32 is opposed to the branch part 412 of the lower electrode 41. The branch part 322 of the upper electrode 32 is opposed to the branch part 422 of the lower electrode 42.

The MR element 10A is located between the branch part 411 of the lower electrode 41 and the branch part 311 of the upper electrode 31. The MR element 10B is located between the branch part 421 of the lower electrode 42 and the branch part 312 of the upper electrode 31. The MR element 10C is located between the branch part 422 of the lower electrode 42 and the branch part 322 of the upper electrode 32. The MR element 10D is located between the branch part 412 of the lower electrode 41 and the branch part 321 of the upper electrode 32.

As shown in FIG. 10, the base part 310 of the upper electrode 31 includes a first output port E1. The base part 320 of the upper electrode 32 includes a second output port E2. The base part 410 of the lower electrode 41 includes a power supply port V. The base part 420 of the lower electrode 42 includes a ground port G.

The MR element 10A and the MR element 10B are connected in series via the upper electrode 31. The MR element 10C and the MR element 10D are connected in series via the upper electrode 32.

As shown in FIG. 11, one end of the MR element 10A is connected to the power supply port V. The other end of the MR element 10A is connected to the first output port E1. One end of the MR element 10B is connected to the first output port E1. The other end of the MR element 10B is connected to the ground port G. The MR elements 10A and 10B constitute a half-bridge circuit. One end of the MR element 10C is connected to the second output port E2. The other end of the MR element 10C is connected to the ground port G. One end of the MR element 10D is connected to the power supply port V. The other end of the MR element 10D is connected to the second output port E2. The MR elements 10C and 10D constitute a half-bridge circuit. The MR elements 10A, 10B, 10C and 10D constitute a Wheatstone bridge circuit.

A power supply voltage of a predetermined magnitude is applied to the power supply port V. The ground port G is grounded. Each of the MR elements 10A, 10B, 10C and 10D varies in resistance depending on the target magnetic field. The resistances of the MR elements 10A and 10C vary in phase with each other. The resistances of the MR elements 10B and 10D vary 180° out of phase with the resistances of the MR elements 10A and 10C. The first output port E1 outputs a first detection signal corresponding to the potential at the connection point between the MR elements 10A and 10B. The second output port E2 outputs a second detection signal corresponding to the potential at the connection point between the MR elements 10D and 10C. The first and second detection signals vary depending on the target magnetic field. The second detection signal is 180° out of phase with the first detection signal. The magnetic sensor 4 generates an output signal by a computation that includes determining the difference between the first detection signal and the second detection signal. For example, the output signal from the magnetic sensor 4 is generated by adding a predetermined offset voltage to a signal obtained by subtracting the second detection signal from the first detection signal. The output signal from the magnetic sensor 4 varies depending on the target magnetic field.

Figure 12:
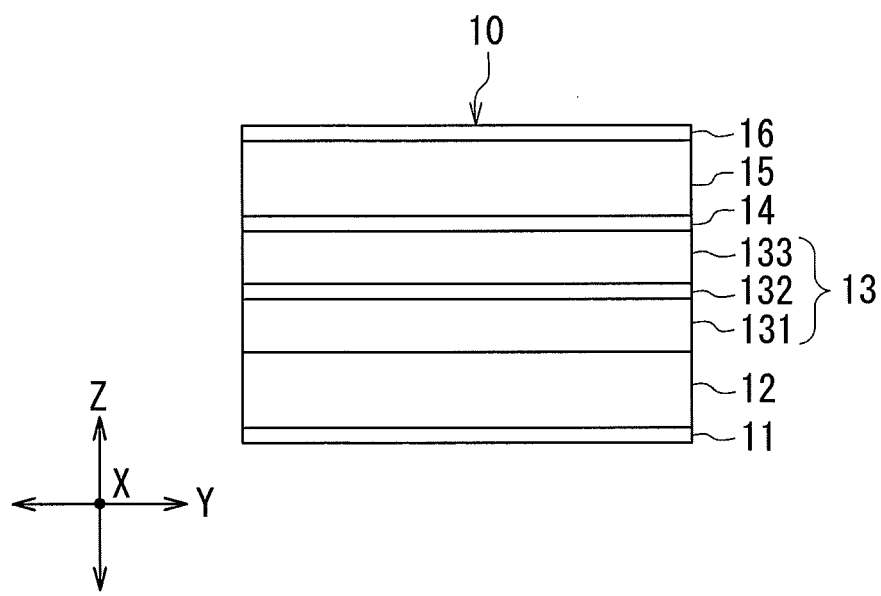
FIG. 12 is a side view illustrating an example of the configuration of an MR element of the first embodiment of the invention.

An example of the configuration of the MR elements 10A to 10D will now be described with reference to FIG. 12. FIG. 12 is a side view illustrating an example of the configuration of the MR elements 10A to 10D. In the following description, reference numeral 10 is used to represent each MR element, and reference numerals 30 and 40 are used to represent each upper electrode and each lower electrode, respectively. In the first embodiment, the MR element 10 is a spin-valve MR element. The MR element 10 includes at least a magnetization pinned layer 13 having a magnetization pinned in a certain direction, a free layer 15 having a magnetization that varies depending on the target magnetic field, and a nonmagnetic layer 14 located between the magnetization pinned layer 13 and the free layer 15.

In the example shown in FIG. 12, the MR element 10 further includes an underlayer 11, an antiferromagnetic layer 12 and a protective layer 16. In this example, the underlayer 11, the antiferromagnetic layer 12, the magnetization pinned layer 13, the nonmagnetic layer 14, the free layer 15 and the protective layer 16 are stacked in this order along the Z direction, the underlayer 11 being closest to the lower electrode 40. The underlayer 11 and the protective layer 16 are conductive. The underlayer 11 is provided to eliminate the effects of the crystal axis of the non-illustrated substrate and to improve the crystallinity and orientability of the layers to be formed over the underlayer 11. The underlayer 11 may be formed of Ta or Ru, for example. The antiferromagnetic layer 12 is to pin the direction of the magnetization of the magnetization pinned layer 13 by means of exchange coupling with the magnetization pinned layer 13. The antiferromagnetic layer 12 is formed of an antiferromagnetic material such as IrMn or PtMn.

The magnetization of the magnetization pinned layer 13 is pinned in a certain direction by the exchange coupling between the antiferromagnetic layer 12 and the magnetization pinned layer 13. In the example shown in FIG. 12, the magnetization pinned layer 13 includes an outer layer 131, a nonmagnetic intermediate layer 132 and an inner layer 133 stacked in this order on the antiferromagnetic layer 12, and is thus formed as a so-called synthetic pinned layer. The outer layer 131 and the inner layer 133 are each formed of a ferromagnetic material such as CoFe, CoFeB or CoNiFe. The outer layer 131 is exchange-coupled to the antiferromagnetic layer 12 and thus the magnetization direction thereof is pinned. The outer layer 131 and the inner layer 133 are antiferromagnetically coupled to each other, and their magnetizations are thus pinned in mutually opposite directions. The nonmagnetic intermediate layer 132 induces antiferromagnetic exchange coupling between the outer layer 131 and the inner layer 133 so as to pin the magnetizations of the outer layer 131 and the inner layer 133 in mutually opposite directions. The nonmagnetic intermediate layer 132 is formed of a nonmagnetic material such as Ru. When the magnetization pinned layer 13 includes the outer layer 131, the nonmagnetic intermediate layer 132 and the inner layer 133, the direction of the magnetization of the magnetization pinned layer 13 refers to that of the inner layer 133.

If the MR element 10 is a TMR element, the nonmagnetic layer 14 is a tunnel barrier layer. The tunnel barrier layer may be formed by oxidizing a part or the whole of a magnesium layer. If the MR element 10 is a GMR element, the nonmagnetic layer 14 is a nonmagnetic conductive layer. The free layer 15 is formed of, for example, a soft magnetic material such as CoFe, CoFeB, NiFe, or CoNiFe. The protective layer 16 is provided for protecting the layers located thereunder. The protective layer 16 may be formed of Ta, Ru, W, or Ti, for example.

The underlayer 11 is connected to the lower electrode 40, and the protective layer 16 is connected to the upper electrode 30. The MR element 10 is configured to be supplied with current by the lower electrode 40 and the upper electrode 30. The current flows in a direction intersecting the plane of the layers constituting the MR element 10, such as the Z direction which is perpendicular to the plane of the layers constituting the MR element 10.

In the MR element 10, the magnetization of the free layer 15 varies depending on the magnetic field applied to the free layer 15. More specifically, the direction and magnitude of the magnetization of the free layer 15 vary depending on the direction and magnitude of the magnetic field applied to the free layer 15. The MR element 10 varies in resistance depending on the direction and magnitude of the magnetization of the free layer 15. For example, if the free layer 15 has a magnetization of a constant magnitude, the MR element 10 has a minimum resistance when the magnetization of the free layer 15 is in the same direction as that of the magnetization pinned layer 13, and has a maximum resistance when the magnetization of the free layer 15 is in the opposite direction to that of the magnetization pinned layer 13.

FIG. 10 shows an example in which the MR element 10 has a cylindrical shape. However, the MR element 10 may have other shapes such as a rectangular solid shape.

Reference is now made to FIG. 10 and FIG. 11 to describe the magnetization directions of the magnetization pinned layers 13 of the MR elements 10A to 10D. In FIG. 10 and FIG. 11 the filled arrows in the MR elements 10A to 10D indicate the magnetization directions of the magnetization pinned layers 13 of the MR elements 10A to 10D. Now, a third direction D3 and a fourth direction D4 will be defined as shown in FIG. 10 and FIG. 11. In the first embodiment, each of the third and fourth directions D3 and D4 is one particular direction parallel to the X direction. In FIG. 10 and FIG. 11, the third direction D3 is rightward. The fourth direction D4 is opposite to the third direction D3.

As shown in FIG. 10 and FIG. 11, the magnetization pinned layer 13 of the MR element 10A is magnetized in the fourth direction D4, and the magnetization pinned layer 13 of the MR element 10B is magnetized in the third direction D3. In this case, the potential at the connection point between the MR elements 10A and 10B varies depending on the strength of a component of the target magnetic field in a direction parallel to the third and fourth directions D3 and D4, i.e., in the X direction. Such a component of the target magnetic field will be referred to as the X-directional component of the target magnetic field. The first output port E1 outputs the first detection signal corresponding to the potential at the connection point between the MR elements 10A and 10B. The first detection signal represents the strength of the X-directional component of the target magnetic field.

As shown in FIG. 10 and FIG. 11, the magnetization pinned layer 13 of the MR element 10C is magnetized in the fourth direction D4, and the magnetization pinned layer 13 of the MR element 10D is magnetized in the third direction D3. In this case, the potential at the connection point between the MR elements 10C and 10D varies depending on the strength of the X-directional component of the target magnetic field. The second output port E2 outputs the second detection signal corresponding to the potential at the connection point between the MR elements 10C and 10D. The second detection signal represents the strength of the X-directional component of the target magnetic field.

As for the MR element 10A and the MR element 10D, their respective magnetization pinned layers 13 are magnetized in mutually opposite directions. As for the MR element 10B and the MR element 10C, their respective magnetization pinned layers 13 are magnetized in mutually opposite directions. Thus, the second detection signal has a phase difference of 180° with respect to the first detection signal.

In consideration of the production accuracy of the MR elements 10A to 10D and other factors, the magnetization directions of the magnetization pinned layers 13 of the MR elements 10A to 10D may be slightly different from the above-described directions.

The operations and effects of the magnetic field generator 100 and the magnetic sensor system according to the first embodiment will now be described. In the first embodiment, each of the plurality of magnetic field generation units 200 includes the first ferromagnetic material section 220 and the first antiferromagnetic material section 210. The first antiferromagnetic material section 210 is exchange-coupled to the first ferromagnetic material section 220. The direction of the magnetization of the first ferromagnetic material section 220 is thereby defined.

The effects of the magnetic field generator 100 and the magnetic sensor system according to the first embodiment will be described in comparison with a magnetic field generator and a magnetic sensor system of a comparative example. The magnetic field generator of the comparative example includes, in place of the plurality of magnetic field generation units 200 of the first embodiment, a plurality of magnetic field generation units each formed of a permanent magnet. The magnetic sensor system of the comparative example uses the magnetic field generator of the comparative example, in place of the magnetic field generator 100 according to the first embodiment.

Figure 13:
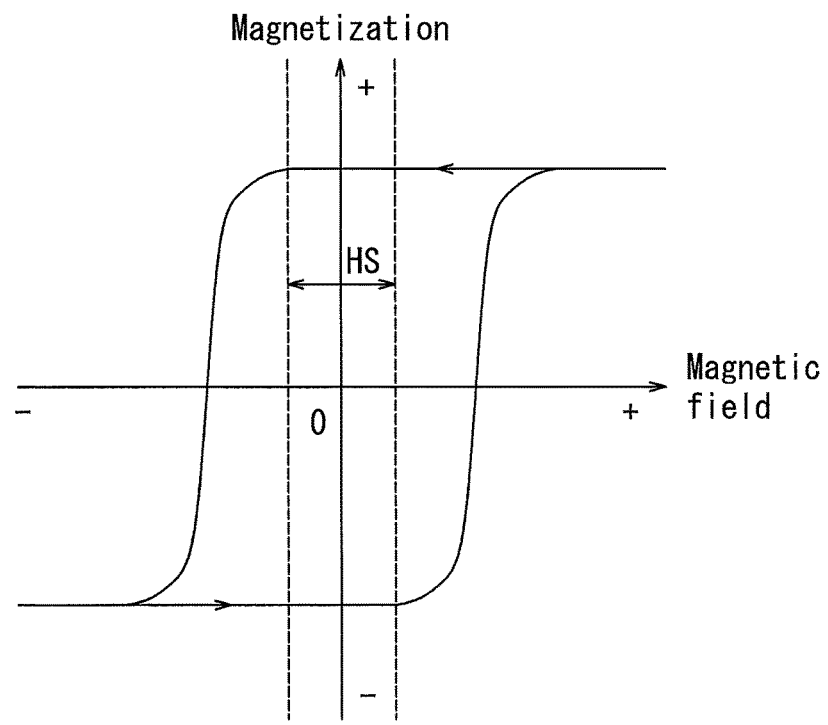
FIG. 13 is a characteristic diagram illustrating the magnetization curve of a permanent magnet.
Figure 14:
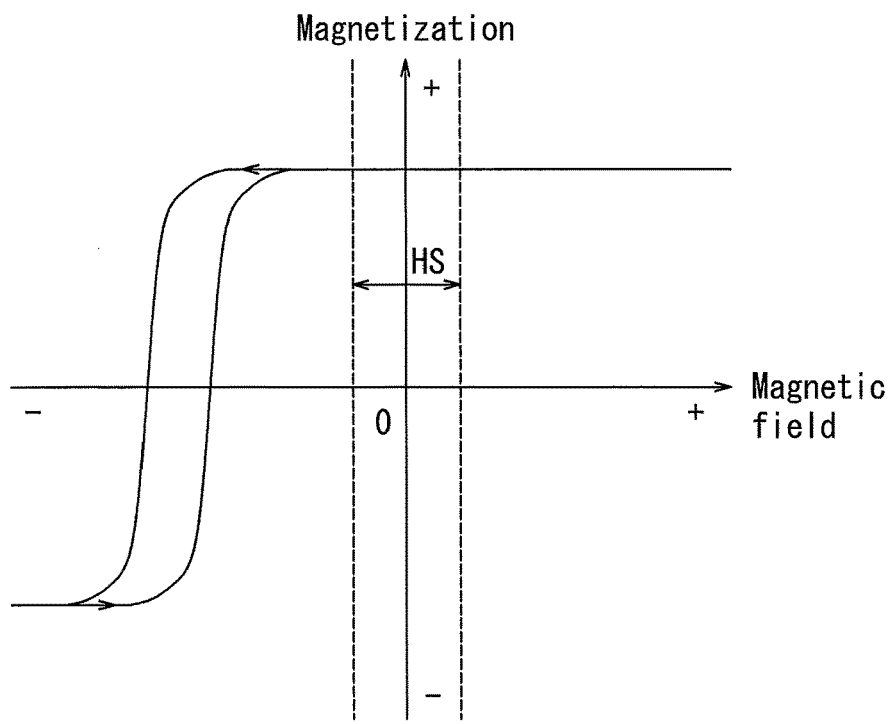
FIG. 14 is a characteristic diagram illustrating the magnetization curve of the magnetic field generation unit.

First, with reference to FIG. 13 and FIG. 14, comparisons will be made between a magnetization curve of a permanent magnet and that of the magnetic field generation unit 200. FIG. 13 is a characteristic diagram illustrating the magnetization curve of a permanent magnet. FIG. 14 is a characteristic diagram illustrating the magnetization curve of one magnetic field generation unit 200. In each of FIG. 13 and FIG. 14, the horizontal axis represents magnetic field, and the vertical axis represents magnetization. For both of the magnetic field and the magnetization, positive values represent magnitude in a predetermined direction, while negative values represent magnitude in the opposite direction from the predetermined direction. Arrows in the magnetization curves indicate the direction of a change in the magnetic field. The range of the magnetic field indicated with the symbol HS represents the range of the target magnetic field.

The magnetic sensor system of the comparative example is used under the condition that the strength of the target magnetic field does not exceed the coercivity of the permanent magnet. However, a disturbance magnetic field having a strength exceeding the coercivity of the permanent magnet can happen to be temporarily applied to the permanent magnet, because the magnetic sensor system can be used in various environments. When such a disturbance magnetic field is temporarily applied to the permanent magnet, the direction of the magnetization of the permanent magnet may be changed from an original direction and then remain different from the original direction even after the disturbance magnetic field disappears. For example, as shown in FIG. 13, if a disturbance magnetic field of a positive value beyond the range HS of the target magnetic field is temporarily applied to the permanent magnet, the direction of the magnetization of the permanent magnet is pinned in a positive direction after the disturbance magnetic field disappears. On the other hand, if a disturbance magnetic field of a negative value falling outside the range HS of the target magnetic field is temporarily applied to the permanent magnet, the direction of the magnetization of the permanent magnet is pinned in a negative direction after the disturbance magnetic field disappears. Thus, in the magnetic sensor of the comparative example, the direction of the magnetic field generated by the magnetic field generator may change from a desired direction if a disturbance magnetic field having a strength exceeding the coercivity of the permanent magnet is temporarily applied to the permanent magnet.

In contrast, in the magnetic field generation unit 200 of the first embodiment, as understood from FIG. 14, even if a disturbance magnetic field having a high strength sufficient to reverse the direction of the magnetization of the first ferromagnetic material section 220 is temporarily applied, the direction of the magnetization of the first ferromagnetic material section 220 returns to an original direction upon disappearance of such a disturbance magnetic field. Thus, the magnetic field generator 100 according to the first embodiment has high immunity to disturbance magnetic fields. This effect is enhanced by the configuration in which each of the magnetic field generation units 200 includes a plurality of antiferromagnetic material sections, as in the fifth to eighth examples of the magnetic field generation units 200.

The magnetic field generator 100 according to the first embodiment can be easily fabricated without the need for increasing the distance between two adjacent magnetic field generation units 200. The magnetic field generator 100 according to the first embodiment is fabricated by, for example, the following first or second method. The first method will be described first. In the first method, a plurality of magnetic field generation units 200A (see FIG. 2) in which the magnetizations of the first ferromagnetic material sections 220 are set in the first direction D1 and a plurality of magnetic field generation units 200B (see FIG. 2) in which the magnetizations of the first ferromagnetic material sections 220 are set in the second direction D2 are formed in separate steps. The plurality of magnetic field generation units 200A are formed while applying a magnetic field in the first direction D1. The magnetization of the first ferromagnetic material section 220 in each of the plurality of magnetic field generation units 200A is thereby set in the first direction D1. In a like manner, the plurality of magnetic field generation units 200B are formed while applying a magnetic field in the second direction D2. The magnetization of the first ferromagnetic material section 220 in each of the plurality of magnetic field generation units 200B is thereby set in the second direction D2.

For example, a situation in which the step of forming the plurality of magnetic field generation units 200A precedes the step of forming the plurality of magnetic field generation units 200B will be considered. In this case, in the step of forming the plurality of magnetic field generation units 200B, the already formed plurality of magnetic field generation units 200A are subjected to the magnetic field in the second direction D2. This may temporarily reverse the direction of the magnetizations of the first ferromagnetic material sections 220 in the plurality of magnetic field generation units 200A. Even in such a case, the direction of the magnetizations of the first ferromagnetic material sections 220 in the plurality of magnetic field generation units 200A returns to the first direction D1 upon disappearance of the magnetic field in the second direction D2.

Next, the second method will be described. The second method first forms an initial magnetic field generator including a plurality of initial magnetic field generation units in which the magnetizations of the first ferromagnetic material sections 220 are not set in a predetermined direction. The plurality of initial magnetic field generation units include a plurality of first initial magnetic field generation units intended to be the plurality of magnetic field generation units 200A, and a plurality of second initial magnetic field generation units intended to be the plurality of magnetic field generation units 200B.

Next, while a magnetic field in the first direction D1 is applied to each of the plurality of first initial magnetic field generation units, the temperature of each of the plurality of first initial magnetic field generation units is increased to a higher level than the blocking temperature of the antiferromagnetic material section 210 included in each of the plurality of first initial magnetic field generation units, and thereafter decreased. The magnetization of the first ferromagnetic material section 220 in each of the plurality of first initial magnetic field generation units is thereby set in the first direction D1, so that the plurality of first initial magnetic field generation units become the plurality of magnetic field generation units 200A.

Next, while a magnetic field in the second direction D2 is applied to each of the plurality of second initial magnetic field generation units, the temperature of each of the plurality of second initial magnetic field generation units is increased to a higher level than the blocking temperature of the antiferromagnetic material section 210 included in each of the plurality of second initial magnetic field generation units, and thereafter decreased. The magnetization of the first ferromagnetic material section 220 in each of the plurality of second initial magnetic field generation units is thereby set in the second direction D2, so that the plurality of second initial magnetic field generation units become the plurality of magnetic field generation units 200B. Note that the plurality of magnetic field generation units 200A may be formed after the formation of the plurality of magnetic field generation units 200B.

Both of the first and second methods make it possible to easily set the direction of the magnetization of the first ferromagnetic material section 220 in each of two adjacent magnetic field generation units 200 without the need for increasing the distance between the two adjacent magnetic field generation units 200.

Thus, the first embodiment provides the magnetic field generator 100 which includes the plurality of magnetic field generation units 200 arranged in a desired pattern and which has high immunity to disturbance magnetic fields. The first embodiment also provides the magnetic sensor system including the magnetic field generator 100. Further, according to the first embodiment, a reduction in the distance between two adjacent magnetic field generation units 200 serves to improve the resolution of the magnetic sensor system.

Second Embodiment

Figure 15:
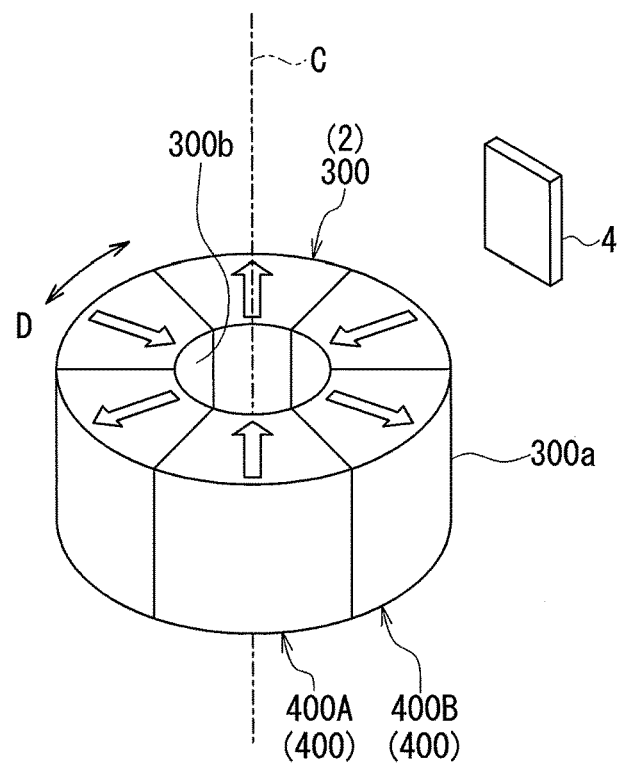
FIG. 15 is a perspective view illustrating the general configuration of a magnetic sensor system according to a second embodiment of the invention.

A second embodiment of the invention will now be described with reference to FIG. 15. FIG. 15 is a perspective view illustrating the general configuration of a magnetic sensor system according to the second embodiment. The magnetic sensor system according to the second embodiment differs from the first embodiment in the following ways. The magnetic sensor system according to the second embodiment has a scale 2 in place of the scale 1 of the first embodiment. The scale 2 is a rotary scale of annular shape formed of a magnetic field generator 300 according to the second embodiment. The magnetic field generator 300 includes a plurality of magnetic field generation units 400 arranged in a predetermined pattern to generate a plurality of external magnetic fields. The plurality of magnetic field generation units 400 are annularly arranged to form an aggregation having an outer periphery 300a and an inner periphery 300b. The outer periphery 300a is also the outer periphery of the magnetic field generator 300. The inner periphery 300b is also the inner periphery of the magnetic field generator 300.

The plurality of magnetic field generation units 400 each have a shape that can be formed by, for example, equally cutting a thick cylinder into N (N is an even number greater than or equal to 2) by one or more planes passing through a central axis C of the cylinder. FIG. 15 shows an example in which N, i.e., the number of the plurality of magnetic field generation units 400, is six.

The magnetic sensor 4 is placed to face the outer periphery 300a. The scale 2 rotates about the central axis C in a rotational direction D in response to a rotational movement of a moving object (not illustrated). The relative positional relationship between the scale 2 and the magnetic sensor 4 is thereby changed in the rotational direction D. The magnetic sensor system detects a physical quantity associated with the relative positional relationship between the scale 2 and the magnetic sensor 4. More specifically, the magnetic sensor system detects, as the aforementioned physical quantity, the rotational position and/or the rotational speed of the aforementioned moving body moving with the scale 2.

The plurality of magnetic field generation units 400 each have the same internal configuration as that of the plurality of the magnetic field generation units 200 of the first embodiment. More specifically, the plurality of magnetic field generation units 400 each include the first ferromagnetic material section and the first antiferromagnetic material section. The first ferromagnetic material section and the first antiferromagnetic material section are stacked along a direction parallel to the central axis C. The remainder of configuration of the magnetic field generation units 400 is the same as that of any of the first to eighth examples of the magnetic field generation units 200 described in relation to the first embodiment.

In FIG. 15, the hollow arrows indicate the directions of the magnetizations of the first ferromagnetic material sections. In FIG. 15, reference symbols 400A and 400B represent any two adjacent ones of the plurality of magnetic field generation units 400. As shown in FIG. 15, the two magnetic field generation units 400A and 400B are configured so that the magnetizations of their respective first ferromagnetic material sections are in different directions from each other. In the second embodiment, in particular, the magnetization of the first ferromagnetic material section of the magnetic field generation unit 400A is in the direction from the outer periphery 300a to the inner periphery 300b. The magnetization of the first ferromagnetic material section of the magnetic field generation unit 400B is in the direction from the inner periphery 300b to the outer periphery 300a.

Here, the magnetization direction from the outer periphery 300a to the inner periphery 300b will be referred to as a first direction, and the magnetization direction from the inner periphery 300b to the outer periphery 300a will be referred to as a second direction. In the second embodiment, the plurality of magnetic field generation units 400 are arranged so that the directions of the magnetizations of the first ferromagnetic material sections alternate between the first direction and the second direction.

A change in the relative positional relationship between the scale 2 and the magnetic sensor 4 causes a change in the direction of the target magnetic field for the magnetic sensor 4, that is, a magnetic field to be applied to the magnetic sensor 4 on the basis of part of the plurality of external magnetic fields generated by the plurality of magnetic field generation units 400. In the example shown in FIG. 15, the direction of the target magnetic field rotates, within a plane orthogonal to the central axis C, about the location at which the magnetic sensor 4 is placed. In the example shown in FIG. 15, one rotation of the scale 2 causes the direction of the target magnetic field to rotate six times, that is, to change by six periods, in particular.

The magnetic sensor 4 according to the second embodiment has the same configuration as in the example of the first embodiment shown in FIG. 10 and FIG. 11. Note that in second embodiment, the magnetic sensor 4 is placed to face the outer periphery 300a in such an orientation that the Z direction shown in FIG. 10 to FIG. 12 is parallel or almost parallel to a straight line drawn from the location of the magnetic sensor 4 orthogonally to the central axis C, and the X direction shown in FIG. 10 to FIG. 12 is parallel or almost parallel to a plane orthogonal to the central axis C.

The remainder of configuration, function and effects of the second embodiment are similar to those of the first embodiment.

Third Embodiment

Figure 16:
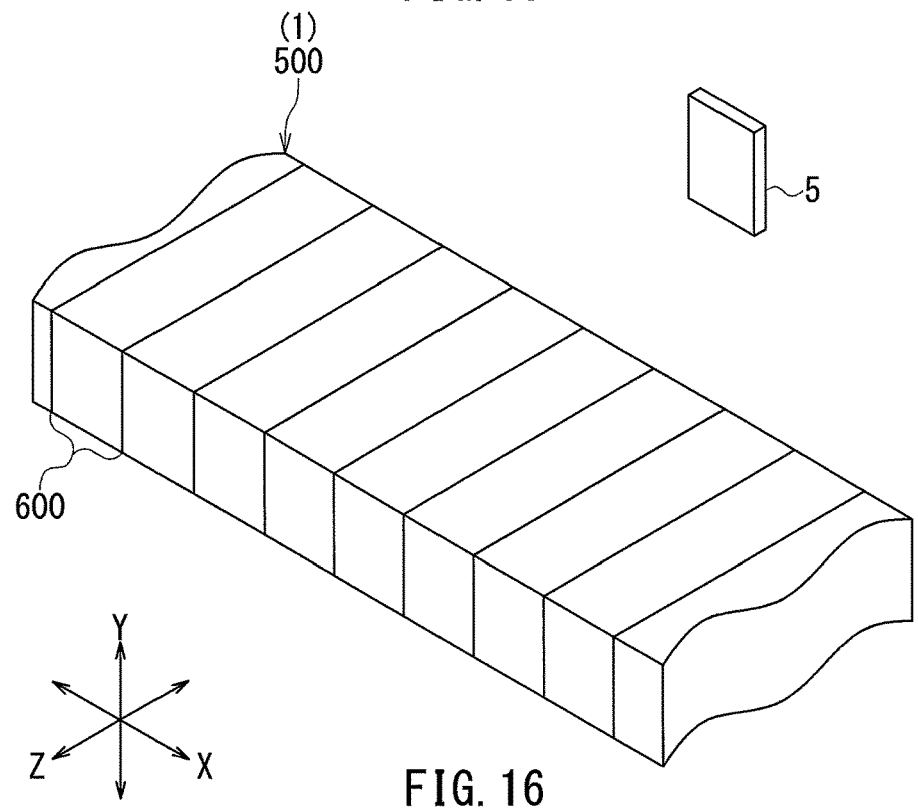
FIG. 16 is a perspective view illustrating the general configuration of a magnetic sensor system of a third embodiment of the invention.

A third embodiment of the invention will now be described with reference to FIG. 16. FIG. 16 is a perspective view illustrating the general configuration of a magnetic sensor system of the third embodiment. The magnetic sensor system of the third embodiment includes a scale 1, which is a linear scale, and a magnetic sensor 5 according to the third embodiment. The positional relationship between the scale 1 and the magnetic sensor 5 and the relative movement of the scale 1 with respect to the magnetic sensor 5 are the same as the positional relationship between the scale 1 and the magnetic sensor 4 in the first embodiment and the relative movement of the scale 1 with respect to the magnetic sensor 4 in the first embodiment.

In the third embodiment, the scale 1 is formed of a magnetic field generator 500. The magnetic field generator 500 includes a plurality of magnetic field generation units 600 arranged in a predetermined pattern to generate a plurality of external magnetic fields. In the third embodiment, the plurality of magnetic field generation units 600 are arranged in a row. The plurality of magnetic field generation units 600 may have the same configuration as the plurality of magnetic field generation units 200 of the first embodiment. Alternatively, the plurality of magnetic field generation units 600 may each be formed of a permanent magnet. The magnetizations of the plurality of magnetic field generation units 600 are set in alternating directions.

Figure 17:
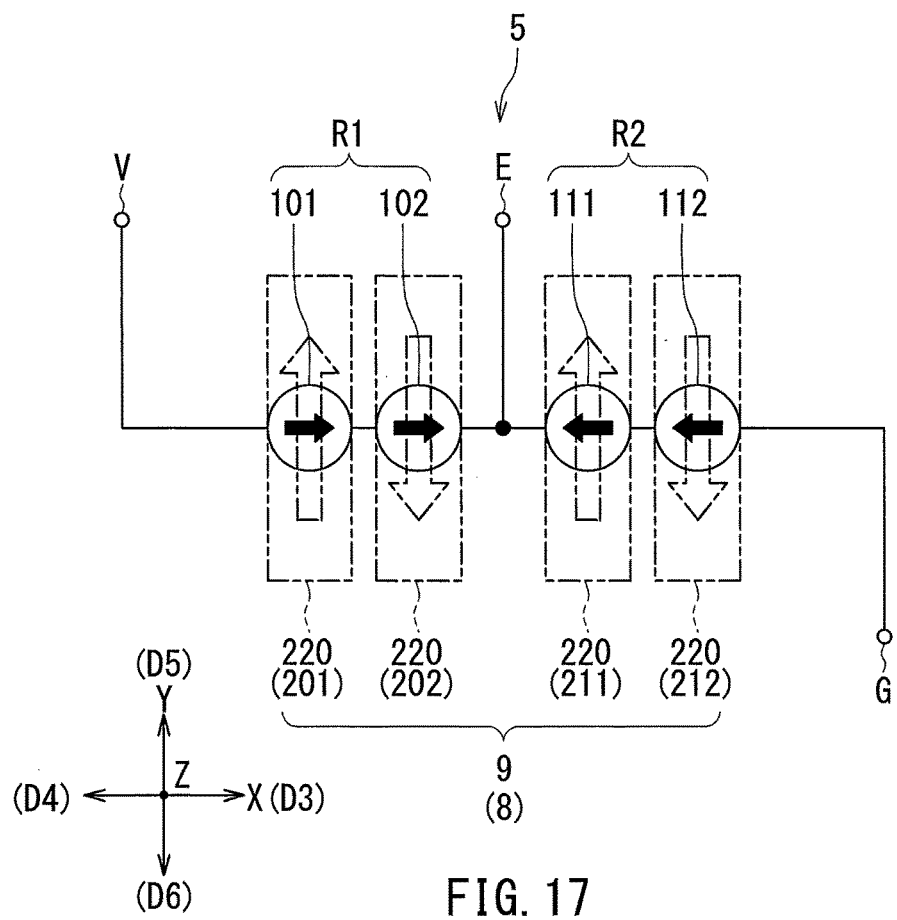
FIG. 17 is a circuit diagram of a magnetic sensor according to the third embodiment of the invention.
Figure 18:
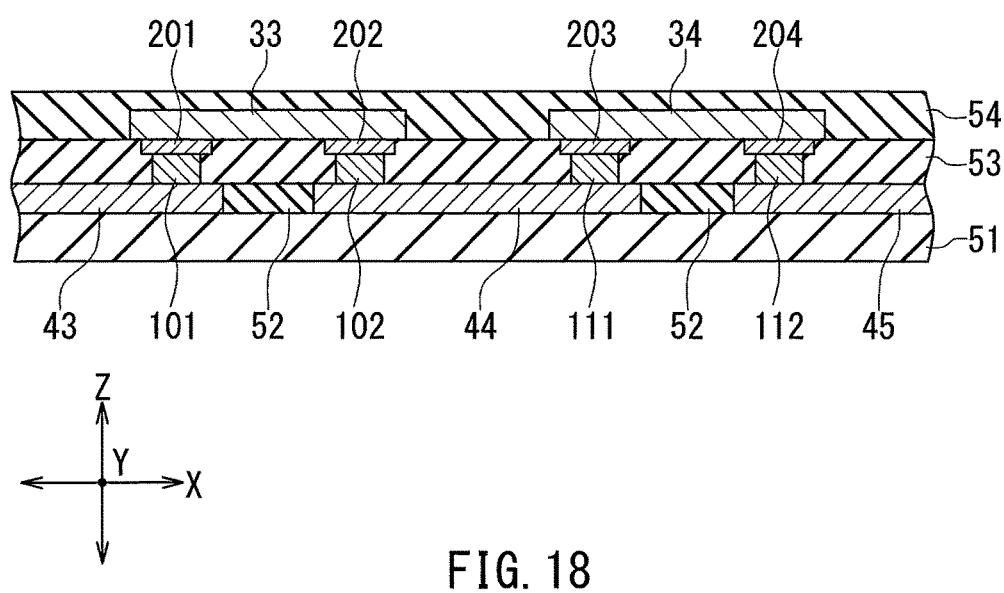
FIG. 18 is a cross-sectional view of a part of the magnetic sensor according to the third embodiment of the invention.

The magnetic sensor 5 according to the third embodiment will now be described with reference to FIG. 17 and FIG. 18. FIG. 17 is a circuit diagram of the magnetic sensor 5. FIG. 18 is a cross-sectional view of a part of the magnetic sensor 5. The magnetic sensor 5 includes a plurality of magnetic detection elements for detecting a target magnetic field, and a bias magnetic field generator 8 for generating a plurality of bias magnetic fields to be applied to the plurality of magnetic detection elements. In the third embodiment, each of the plurality of magnetic detection elements is an MR element.

The bias magnetic field generator 8 is formed of a magnetic field generator 9 according to the third embodiment. The magnetic field generator 9 includes a plurality of magnetic field generation units arranged in a predetermined pattern to generate a plurality of external magnetic fields.

The plurality of magnetic field generation units of the third embodiment have basically the same configuration as the plurality of magnetic field generation units 200 of the first embodiment. More specifically, each of the plurality of magnetic field generation units of the third embodiment includes at least the first ferromagnetic material section and the first antiferromagnetic material section. In the third embodiment, the first ferromagnetic material section is denoted by reference numeral 220 and the first antiferromagnetic material section is denoted by reference numeral 210, as in the first embodiment. Each of the aforementioned plurality of bias magnetic fields results from the magnetization of the first ferromagnetic material section 220 of at least one of the plurality of magnetic field generation units.

In the third embodiment, in particular, the plurality of MR elements of the magnetic sensor 5 include two MR elements 101 and 102 connected in series, and two MR elements 111 and 112 connected in series. The MR elements 101 and 111 each correspond to the first magnetic detection element of the present invention. The MR elements 102 and 112 each correspond to the second magnetic detection element of the present invention.

In the third embodiment, the plurality of magnetic field generation units of the magnetic field generator 9 include two first magnetic field generation units 201 and 211 and two second magnetic field generation units 202 and 212.

As shown in FIG. 18, the magnetic sensor 5 further includes a substrate 51, two upper electrodes 33 and 34, and three lower electrodes 43, 44 and 45. The lower electrodes 43, 44 and 45 are spaced from each other and arranged in a row on the substrate 51. The MR element 101 lies on a part of the lower electrode 43 near an end thereof closest to the lower electrode 44. The MR element 102 lies on a part of the lower electrode 44 near an end thereof closest to the lower electrode 43. The MR element 111 lies on a part of the lower electrode 44 near an end thereof closest to the lower electrode 45. The MR element 112 lies on a part of the lower electrode 45 near an end thereof closest to the lower electrode 44. The magnetic field generation units 201, 202, 211 and 212 lie on the MR elements 101, 102, 111 and 112, respectively. The upper electrode 33 lies on the magnetic field generation units 201 and 22. The upper electrode 34 lies on the magnetic field generation units 211 and 212.

The magnetic sensor 5 further includes insulating layers 52 and 53 and a protective film 54. The insulating layer 52 lies on the substrate 51 and surrounds the lower electrodes 43, 44 and 45. The insulating layer 53 lies on the lower electrodes 43, 44 and 45 and the insulating layer 52 and surrounds the MR elements 101, 102, 111 and 112 and the magnetic field generation units 201, 202, 211 and 212. The protective film 54 is provided to cover the upper electrodes 33 and 34 and the insulating layer 53.

The magnetic sensor 5 includes a half-bridge circuit. The half-bridge circuit includes a first row R1 of magnetic detection elements and a second row R2 of magnetic detection elements connected in series. As shown in FIG. 17, the first row R1 of magnetic detection elements is constituted by the MR elements 101 and 102. The second row R2 of magnetic detection elements is constituted by the MR elements 111 and 112. The magnetic sensor 5 further includes a power supply port V, a ground port G, and an output port E. One end of the first row R1 of magnetic detection elements is connected to the power supply port V. The other end of the first row R1 of magnetic detection elements is connected to the output port E. One end of the second row R2 of magnetic detection elements is connected to the output port E. The other end of the second row R2 of magnetic detection elements is connected to the ground port G.

A power supply voltage of a predetermined magnitude is applied to the power supply port V. The ground port G is grounded. Each of the MR elements 101, 102, 111 and 112 varies in resistance depending on the target magnetic field. The resistances of the MR elements 101 and 102 vary in phase with each other. The resistances of the MR elements 111 and 112 vary 180° out of phase with the resistances of the MR elements 101 and 102. The output port E outputs a detection signal corresponding to the potential at the connection point between the first row R1 of magnetic detection elements and the second row R2 of magnetic detection elements, i.e., the connection point between the MR element 102 and the MR element 111. The detection signal varies depending on the target magnetic field. The output signal from the magnetic sensor 5 is generated by performing a predetermined computation using the detection signal. For example, the output signal from the magnetic sensor 5 is generated by adding a predetermined offset voltage to the detection signal. The output signal from the magnetic sensor 5 varies depending on the target magnetic field.

Figure 19:
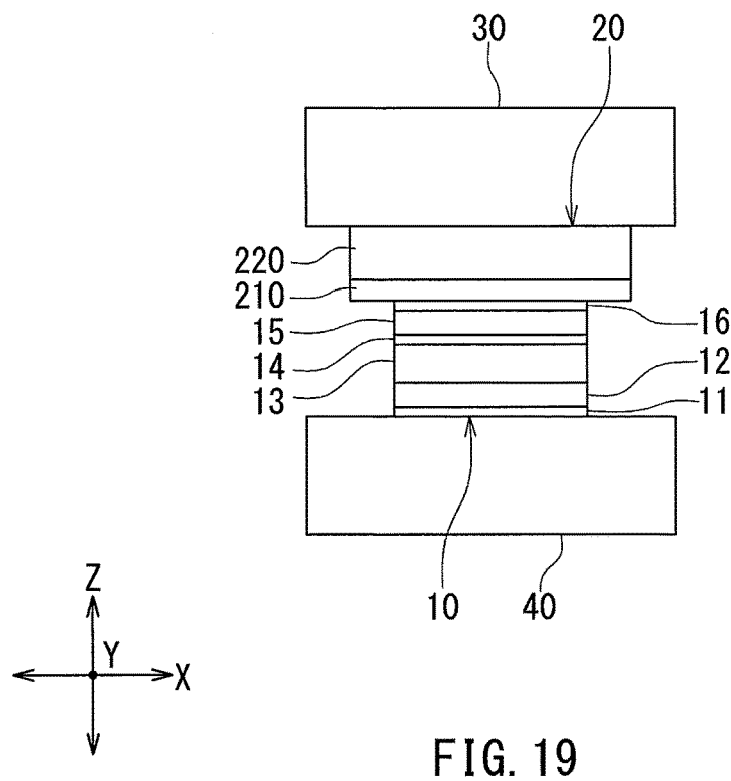
FIG. 19 is a side view illustrating an example of configurations of the MR element and the magnetic field generation unit of the third embodiment of the invention.

Reference is now made to FIG. 19 to describe an example of the configuration of each of the MR elements 101, 102, 111 and 112 and each of the magnetic field generation units 201, 202, 211 and 212. FIG. 19 is a side view illustrating the example of the configuration of each MR element and each magnetic field generation unit. In the following description, reference numerals 10, 20, 30, and 40 are used to represent each MR element, each magnetic field generation unit, each upper electrode, and each lower electrode, respectively.

The MR element 10 has the same configuration as that in the first embodiment. More specifically, the MR element 10 includes at least the magnetization pinned layer 13, the free layer 15; and the nonmagnetic layer 14. In the example shown in FIG. 19, the MR element 10 further includes the underlayer 11, the antiferromagnetic layer 12 and the protective layer 16. In this example, the underlayer 11, the antiferromagnetic layer 12, the magnetization pinned layer 13, the nonmagnetic layer 14, the free layer 15 and the protective layer 16 are stacked in this order along the Z direction, the underlayer 11 being closest to the lower electrode 40.

The magnetic field generation unit 20 includes at least the first ferromagnetic material section 220 and the first antiferromagnetic material section 210. In the example shown in FIG. 19, the first antiferromagnetic material section 210 and the first ferromagnetic material section 220 are stacked in this order along the Z direction, the first antiferromagnetic material section 210 being closer to the MR element 10. In the example shown in FIG. 19, the magnetic field generation unit 20 has the configuration of the first example of the magnetic field generation unit 200 described in relation to the first embodiment. However, the magnetic field generation unit 20 may have the configuration of any of the second to eighth examples of the magnetic field generation units 200 described in relation to the first embodiment.

Reference is now made to FIG. 17 to describe the magnetization directions of the magnetization pinned layers 13 of the MR elements 101, 102, 111 and 112. In FIG. 17, the filled arrows in the MR elements 101, 102, 111 and 112 indicate the magnetization directions of the magnetization pinned layers 13 of the MR elements 101, 102, 111 and 112. Now, a third direction D3 and a fourth direction D4 will be defined as shown in FIG. 17. The definitions of the third and fourth directions D3 and D4 are the same as in the first embodiment. In FIG. 17, the third direction D3 is rightward. The fourth direction D4 is opposite to the third direction D3.

As shown in FIG. 17, the magnetization pinned layers 13 of the MR elements 101 and 102 are magnetized in the third direction D3, and the magnetization pinned layers 13 of the MR elements 111 and 112 are magnetized in the fourth direction D4. In this case, the potential at the connection point between the MR elements 102 and 111 varies depending on the strength of the component of the target magnetic field in the direction parallel to the third and fourth directions D3 and D4, i.e., the X-directional component of the target magnetic field. The output port E outputs a detection signal corresponding to the potential at the connection point between the MR elements 102 and 111. The detection signal represents the strength of the X-directional component of the target magnetic field.

In consideration of the production accuracy of the MR elements and other factors, the magnetization directions of the magnetization pinned layers 13 of the MR elements 101, 102, 111 and 112 may be slightly different from the above-described directions.

Now, the directions of the magnetizations of the first ferromagnetic material sections 220 of the magnetic field generation units 201, 202, 211 and 212 and the bias magnetic fields to be applied to the MR elements 101, 102, 111 and 112 will be described with reference to FIG. 17. In FIG. 17, the arrows drawn in chain double-dashed lines in the magnetic field generation units 201, 202, 211 and 212 indicate the directions of the magnetizations of the first ferromagnetic material sections 220 of the magnetic field generation units 201, 202, 211 and 212.

Now, a fifth direction D5 and a sixth direction D6 will be defined as shown in FIG. 17. In the third embodiment, each of the fifth and sixth directions D5 and D6 is one particular direction parallel to the Y direction. In FIG. 17, the fifth direction D5 is upward. The sixth direction D6 is opposite to the fifth direction D5. In the third embodiment, in particular, the magnetizations of the first ferromagnetic material sections 220 of the magnetic field generation units 201 and 211 are in the fifth direction D5. The magnetizations of the first ferromagnetic material sections 220 of the magnetic field generation units 202 and 212 are in the sixth direction D6.

The magnetic sensor 5 includes a pair of first and second magnetic field generation unit aggregations provided in correspondence with a single half-bridge circuit. The first magnetic field generation unit aggregation includes the magnetic field generation units 201 and 202, and generates two bias magnetic fields to be applied to the MR elements 101 and 102 which constitute the first row R1 of magnetic detection elements. The second magnetic field generation unit aggregation includes the magnetic field generation units 211 and 212, and generates two bias magnetic fields to be applied to the MR elements 111 and 112 which constitute the second row R2 of magnetic detection elements.

The bias magnetic field to be applied to the MR element 101 results from the magnetization of the first ferromagnetic material section 220 of the magnetic field generation unit 201. The bias magnetic field to be applied to the MR element 102 results from the magnetization of the first ferromagnetic material section 220 of the magnetic field generation unit 202. The main component of the bias magnetic field at the location of the MR element 101 is in the sixth direction D6, i.e., the opposite direction to the direction of the magnetization of the first ferromagnetic material section 220 of the magnetic field generation unit 201. The main component of the bias magnetic field at the location of the MR element 102 is in the fifth direction D5, i.e., the opposite direction to the direction of the magnetization of the first ferromagnetic material section 220 of the magnetic field generation unit 202.

The direction of the magnetization of the first ferromagnetic material section 220 of the magnetic field generation unit 201, i.e., the fifth direction D5, intersects the direction of the magnetization of the magnetization pinned layer 13 of the MR element 101, i.e., the third direction D3. The direction of the magnetization of the first ferromagnetic material section 220 of the magnetic field generation unit 202, i.e., the sixth direction D6, intersects the direction of the magnetization of the magnetization pinned layer 13 of the MR element 102, i.e., the third direction D3.

The bias magnetic field to be applied to the MR element 111 results from the magnetization of the first ferromagnetic material section 220 of the magnetic field generation unit 211. The bias magnetic field to be applied to the MR element 112 results from the magnetization of the first ferromagnetic material section 220 of the magnetic field generation unit 212. The main component of the bias magnetic field at the location of the MR element 111 is in the sixth direction D6, i.e., the opposite direction to the direction of the magnetization of the first ferromagnetic material section 220 of the magnetic field generation unit 211. The main component of the bias magnetic field at the location of the MR element 112 is in the fifth direction D5, i.e., the opposite direction to the direction of the magnetization of the first ferromagnetic material section 220 of the magnetic field generation unit 212.

The direction of the magnetization of the first ferromagnetic material section 220 of the magnetic field generation unit 211, i.e., the fifth direction D5, intersects the direction of the magnetization of the magnetization pinned layer 13 of the MR element 111, i.e., the fourth direction D4. The direction of the magnetization of the first ferromagnetic material section 220 of the magnetic field generation unit 212, i.e., the sixth direction D6, intersects the direction of the magnetization of the magnetization pinned layer 13 of the MR element 112, i.e., the fourth direction D4.

The bias magnetic field is used to make the free layer 15 have a single magnetic domain and to orient the magnetization of the free layer 15 in a certain direction, when the strength of the component of the target magnetic field in the direction parallel to the magnetization direction of the pinned layer 13, that is, the X-directional component of the target magnetic field, is zero.

In the third embodiment, the magnetic field generation units 201 and 202, which constitute the first magnetic field generation unit aggregation, are configured so that the magnetizations of their respective first ferromagnetic material sections 220 are in different directions from each other. In the third embodiment, in particular, the magnetic field generation units 201 and 202 are configured so that the main component of the bias magnetic field to be applied to the MR element 101 and the main component of the bias magnetic field to be applied to the MR element 102 are in mutually opposite directions. Thus, according to the third embodiment, the effect of the bias magnetic field on the sensitivity and the like of the MR element 101 and the effect of the bias magnetic field on the sensitivity and the like of the MR element 102 cancel each other out in the first row R1 of magnetic detection elements. As a result, the third embodiment makes it possible to prevent the characteristics of the first row R1 of magnetic detection elements from differing from desired characteristics due to the bias magnetic fields.

Likewise, in the third embodiment, the magnetic field generation units 211 and 212, which constitute the second magnetic field generation unit aggregation, are configured so that the magnetizations of their respective first ferromagnetic material sections 220 are in different directions from each other. In the third embodiment, in particular, the magnetic field generation units 211 and 212 are configured so that the main component of the bias magnetic field to be applied to the MR element 111 and the main component of the bias magnetic field to be applied to the MR element 112 are in mutually opposite directions. Thus, according to the third embodiment, the effect of the bias magnetic field on the sensitivity and the like of the MR element 111 and the effect of the bias magnetic field on the sensitivity and the like of the MR element 112 cancel each other out in the second row R2 of magnetic detection elements. As a result, the third embodiment makes it possible to prevent the characteristics of the second row R2 of magnetic detection elements from differing from desired characteristics due to the bias magnetic fields.

The magnetic field generator 9 according to the third embodiment can be fabricated by the same method as the magnetic field generator 100 according to the first embodiment. As described in relation to the first embodiment, the direction of the magnetization of the first ferromagnetic material section 220 of each of two adjacent magnetic field generation units can be easily set without the need for increasing the distance between the two adjacent magnetic field generation units. According to the third embodiment, it is possible to provide the magnetic field generator 9 which includes the magnetic field generation units 201, 202, 211 and 212 arranged in a desired pattern and which has high immunity to disturbance magnetic fields, and to provide the magnetic sensor 5 including the magnetic field generator 9. Further, according to the third embodiment, a reduction in the distance between two adjacent magnetic field generation units serves to improve flexibility in the arrangement of the magnetic field generation units 201, 202, 211 and 212 and reduce the area to be occupied of the magnetic field generation units 201, 202, 211 and 212.

Modification Example

Figure 20:
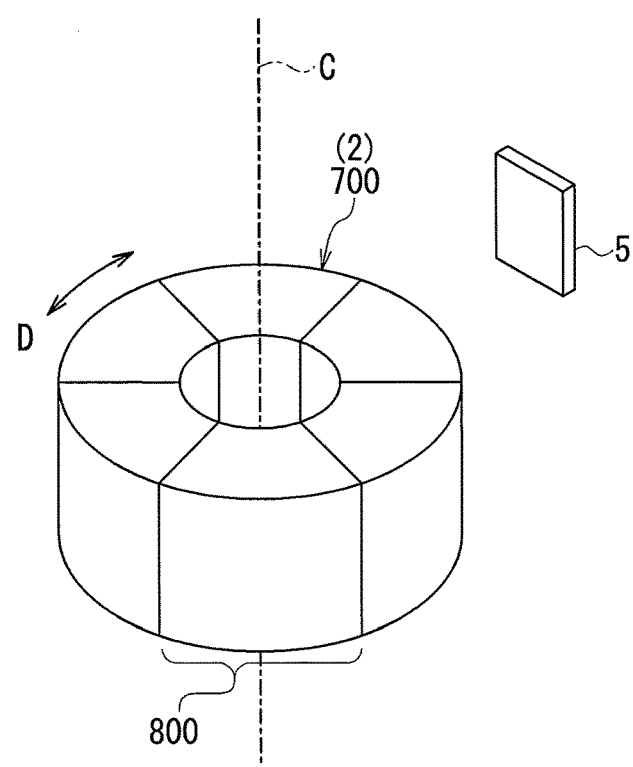
FIG. 20 is a perspective view illustrating the general configuration of a modification example of the magnetic sensor system of the third embodiment of the invention.

A modification example of the magnetic sensor system of the third embodiment will now be described with reference to FIG. 20. FIG. 20 is a perspective view illustrating the general configuration of the modification example of the magnetic sensor system of the third embodiment. In the modification example, the magnetic sensor system has a scale 2, which is a rotary scale of annular shape, instead of the scale 1 shown in FIG. 16. The positional relationship between the scale 2 and the magnetic sensor 5 and the relative movement of the scale 2 with respect to the magnetic sensor 5 are the same as the positional relationship between the scale 2 and the magnetic sensor 4 in the second embodiment and the relative movement of the scale 2 with respect to the magnetic sensor 4 in the second embodiment.

The scale 2 is formed of a magnetic field generator 700. The magnetic field generator 200 includes a plurality of magnetic field generation units 800 arranged in a predetermined pattern to generate a plurality of external magnetic fields. In the modification example, the plurality of magnetic field generation units 800 are annularly arranged to form an aggregation having an outer periphery and an inner periphery, like the plurality of magnetic field generation units 400 of the second embodiment. In the example shown in FIG. 20, the number of the plurality of magnetic field generation units 800 is six. The plurality of magnetic field generation units 800 each have the same internal configuration as that of the plurality of the magnetic field generation units 600 shown in FIG. 16.

The remainder of configuration, function and effects of the third embodiment are similar to those of the first or second embodiment.

Fourth Embodiment

Figure 21:
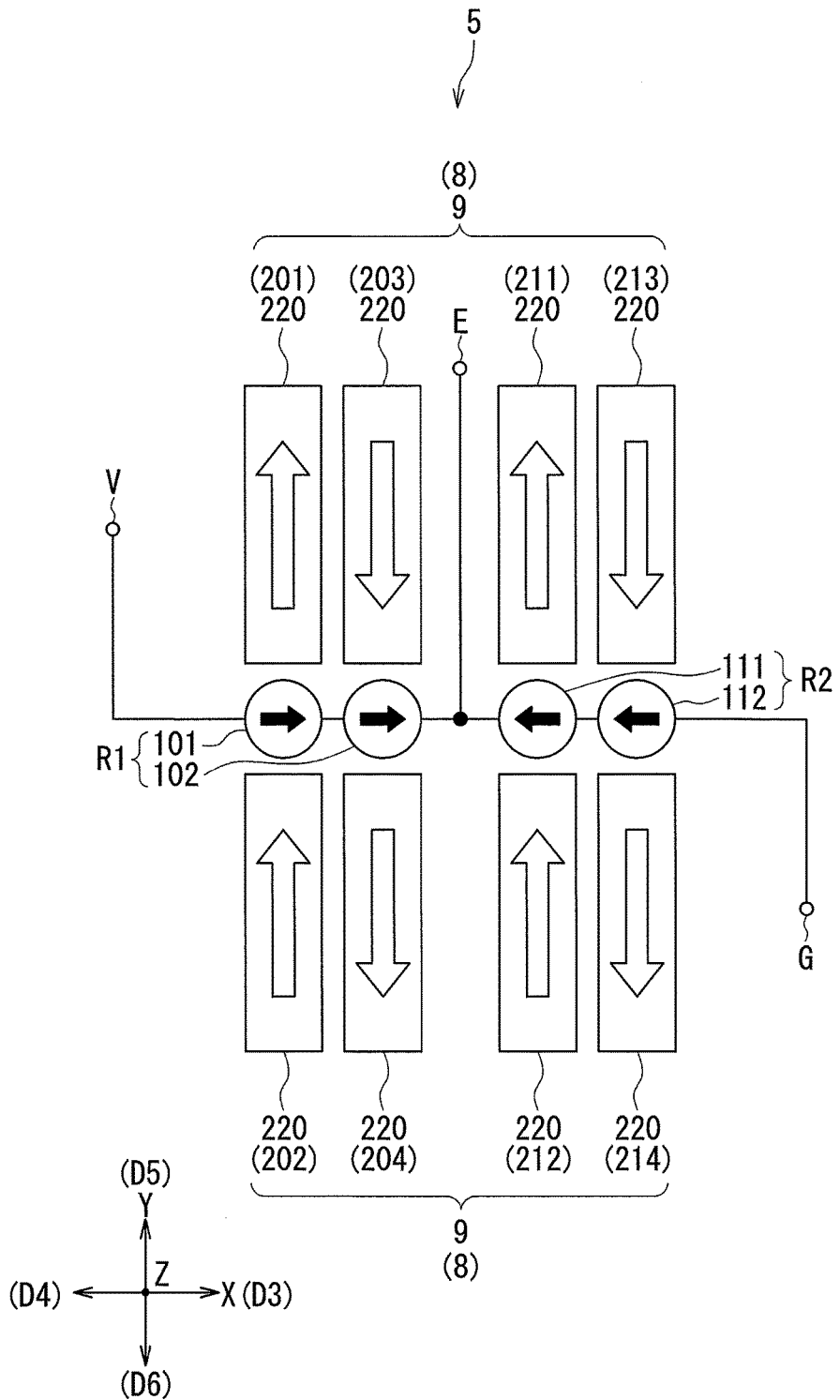
FIG. 21 is a circuit diagram of a magnetic sensor according to a fourth embodiment of the invention.
Figure 22:
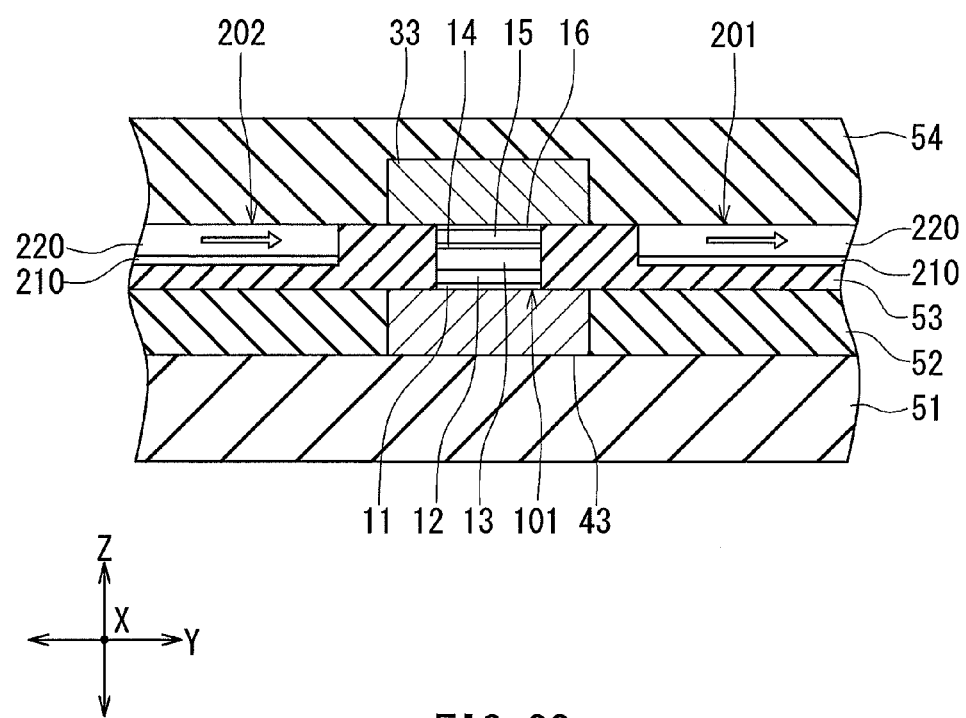
FIG. 22 is a cross-sectional view of a part of the magnetic sensor according to the fourth embodiment of the invention.

A fourth embodiment of the invention will now be described with reference to FIG. 21 and FIG. 22. FIG. 21 is a circuit diagram of a magnetic sensor according to the fourth embodiment. FIG. 22 is a cross-sectional view of the magnetic sensor according to the fourth embodiment. The magnetic sensor 5 according to the fourth embodiment differs from the magnetic sensor according to the third embodiment in the following ways. In the magnetic sensor 5 according to the fourth embodiment, the plurality of magnetic field generation units of the bias magnetic field generator 8 (the magnetic field generator 9) include two first magnetic field generation units 201 and 211, two second magnetic field generation units 202 and 212, two third magnetic field generation units 203 and 213, and two fourth magnetic field generation units 204 and 214.

As shown in FIG. 22, the magnetic field generation units 201 and 202 are embedded in the insulating layer 53. As shown in FIG. 21 and FIG. 22, the magnetic field generation units 201 and 202 are located at a predetermined distance from each other along the Y direction with the MR element 101 interposed therebetween. Similarly, the magnetic field generation units 203, 204 and 211 to 214 are embedded in the insulating layer 53. The magnetic field generation units 203 and 204 are located at a predetermined distance from each other along the Y direction with the MR element 102 interposed therebetween. The magnetic field generation units 211 and 212 are located at a predetermined distance from each other along the Y direction with the MR element 111 interposed therebetween. The magnetic field generation units 213 and 214 are located at a predetermined distance from each other along the Y direction with the MR element 112 interposed therebetween.

As shown in FIG. 21, the magnetic field generation units 201 and 203 are adjacent to each other in the X direction. The magnetic field generation units 202 and 204 are adjacent to each other in the X direction. The magnetic field generation units 211 and 213 are adjacent to each other in the X direction. The magnetic field generation units 212 and 214 are adjacent to each other in the X direction.

In the fourth embodiment, the upper electrode 33 lies on the MR elements 101 and 102. The upper electrode 34 (see FIG. 18) lies on the MR elements 111 and 112.

An example of the configuration of the magnetic field generation units 201 to 204 and 211 to 214 will now be described with reference to FIG. 22. As shown in FIG. 22, each of the magnetic field generation units 201 and 202 includes at least the first ferromagnetic material section 220 and the first antiferromagnetic material section 210. FIG. 22 shows an example in which the first antiferromagnetic material section 210 and the first ferromagnetic material section 220 are stacked along the Z direction. In the example shown in FIG. 22, the magnetic field generation units 201 and 202 have the configuration of the first example of the magnetic field generation units 200 described in relation to the first embodiment. However, the magnetic field generation units 201 and 202 may have the configuration of any of the second to eighth examples of the magnetic field generation units 200 described in relation to the first embodiment.

Although not illustrated, the magnetic field generation units 203, 204 and 211 to 214 have the same configuration as the magnetic field generation units 201 and 202. The above descriptions concerning the magnetic field generation units 201 and 202 hold true for the magnetic field generation units 203, 204 and 211 to 214.

Now, the directions of the magnetizations of the first ferromagnetic material sections 220 of the magnetic field generation units 201 to 204 and 211 to 214 and the bias magnetic fields to be applied to the MR elements 101, 102, 111 and 112 will be described with reference to FIG. 21. In FIG. 21, the hollow arrows in the magnetic field generation units 201 to 204 and 211 to 214 indicate the directions of the magnetizations of the first ferromagnetic material sections 220 of the magnetic field generation units 201 to 204 and 211 to 214.

Now, a fifth direction D5 and a sixth direction D6 will be defined as shown in FIG. 21. The definitions of the fifth and sixth directions D5 and D6 are the same as in the third embodiment. In FIG. 21, the fifth direction D5 is upward. The sixth direction D6 is opposite to the fifth direction D5. The magnetizations of the first ferromagnetic material sections 220 of the magnetic field generation units 201, 202, 211 and 212 are in the fifth direction D5. The magnetizations of the first ferromagnetic material sections 220 of the magnetic field generation units 203, 204, 213 and 214 are in the sixth direction D6.

In the fourth embodiment, the magnetic sensor 5 includes a pair of first and second magnetic field generation unit aggregations provided in correspondence with a single half-bridge circuit, as in the third embodiment. In the fourth embodiment, the first magnetic field generation unit aggregation includes a first group of first to fourth magnetic field generation units 201 to 204, and generates two bias magnetic fields to be applied to the MR elements 101 and 102 which constitute the first row R1 of magnetic detection elements. The second magnetic field generation unit aggregation includes a second group of first to fourth magnetic field generation units 211 to 214, and generates two bias magnetic fields to be applied to the MR elements 111 and 112 which constitute the second row R2 of magnetic detection elements.

The bias magnetic field to be applied to the MR element 101 results from the magnetization of the first ferromagnetic material section 220 of the magnetic field generation unit 201 and the magnetization of the first ferromagnetic material section 220 of the magnetic field generation unit 202. The bias magnetic field to be applied to the MR element 102 results from the magnetization of the first ferromagnetic material section 220 of the magnetic field generation unit 203 and the magnetization of the first ferromagnetic material section 220 of the magnetic field generation unit 204. The main component of the bias magnetic field at the location of the MR element 101 is in the fifth direction D5, i.e., the same direction as the magnetizations of the first ferromagnetic material sections 220 of the magnetic field generation units 201 and 202. The main component of the bias magnetic field at the location of the MR element 102 is in the sixth direction D6, i.e., the same direction as the magnetizations of the first ferromagnetic material sections 220 of the magnetic field generation units 203 and 204.

The magnetization pinned layers 13 of the MR elements 101 and 102 are magnetized in the same direction as those of the third embodiment. Now, third and fourth directions D3 and D4 will be defined as shown in FIG. 21. The definitions of the third and fourth directions D3 and D4 are the same as in the third embodiment. In FIG. 21, the third direction D3 is rightward. The fourth direction D4 is opposite to the third direction D3. As shown in FIG. 21, the magnetization pinned layers 13 of the MR elements 101 and 102 are magnetized in the third direction D3. The direction of the magnetizations of the first ferromagnetic material sections 220 of the magnetic field generation units 201 and 202, i.e., the fifth direction D5, intersects the direction of the magnetization of the magnetization pinned layer 13 of the MR element 101, i.e., the third direction D3. The direction of the magnetizations of the first ferromagnetic material sections 220 of the magnetic field generation units 203 and 204, i.e., the sixth direction D6, intersects the direction of the magnetization of the magnetization pinned layer 13 of the MR element 102, i.e., the third direction D3.

The bias magnetic field to be applied to the MR element 111 results from the magnetization of the first ferromagnetic material section 220 of the magnetic field generation unit 211 and the magnetization of the first ferromagnetic material section 220 of the magnetic field generation unit 212. The bias magnetic field to be applied to the MR element 112 results from the magnetization of the first ferromagnetic material section 220 of the magnetic field generation unit 213 and the magnetization of the first ferromagnetic material section 220 of the magnetic field generation unit 214. The main component of the bias magnetic field at the location of the MR element 111 is in the fifth direction D5, i.e., the same direction as the magnetizations of the first ferromagnetic material sections 220 of the magnetic field generation units 211 and 212. The main component of the bias magnetic field at the location of the MR element 112 is in the sixth direction D6, i.e., the same direction as the magnetizations of the first ferromagnetic material sections 220 of the magnetic field generation units 213 and 214.

The magnetization pinned layers 13 of the MR elements 111 and 112 are magnetized in the same direction as those of the third embodiment. As shown in FIG. 21, the magnetization pinned layers 13 of the MR elements 111 and 112 are magnetized in the fourth direction D4. The direction of the magnetizations of the first ferromagnetic material sections 220 of the magnetic field generation units 211 and 212, i.e., the fifth direction D5, intersects the direction of the magnetization of the magnetization pinned layer 13 of the MR element 111, i.e., the fourth direction D4. The direction of the magnetizations of the first ferromagnetic material sections 220 of the magnetic field generation units 213 and 214, i.e., the sixth direction D6, intersects the direction of the magnetization of the magnetization pinned layer 13 of the MR element 112, i.e., the fourth direction D4.

In the fourth embodiment, the magnetic field generation units 201 and 203 are adjacent to each other and configured so that the magnetizations of their respective first ferromagnetic material sections 220 are in different directions from each other. The magnetic field generation units 202 and 204 are adjacent to each other and configured so that the magnetizations of their respective first ferromagnetic material sections 220 are in different directions from each other. In the fourth embodiment, in particular, the magnetic field generation units 201 to 204 are configured so that the main component of the bias magnetic field to be applied to the MR element 101 and the main component of the bias magnetic field to be applied to the MR element 102 are in mutually opposite directions. Thus, according to the fourth embodiment, the effect of the bias magnetic field on the sensitivity and the like of the MR element 101 and the effect of the bias magnetic field on the sensitivity and the like of the MR element 102 cancel each other out in the first row R1 of magnetic detection elements. As a result, the fourth embodiment makes it possible to prevent the characteristics of the first row R1 of magnetic detection elements from differing from desired characteristics due to the bias magnetic fields.

Likewise, in the fourth embodiment, the magnetic field generation units 211 and 213 are adjacent to each other and configured so that the magnetizations of their respective first ferromagnetic material sections 220 are in different directions from each other. The magnetic field generation units 212 and 214 are adjacent to each other and configured so that the magnetizations of their respective first ferromagnetic material sections 220 are in different directions from each other. In the fourth embodiment, in particular, the magnetic field generation units 211 to 214 are configured so that the main component of the bias magnetic field to be applied to the MR element 111 and the main component of the bias magnetic field to be applied to the MR element 112 are in mutually opposite directions. Thus, according to the fourth embodiment, the effect of the bias magnetic field on the sensitivity and the like of the MR element 111 and the effect of the bias magnetic field on the sensitivity and the like of the MR element 112 cancel each other out in the second row R2 of magnetic detection elements. As a result, the fourth embodiment makes it possible to prevent the characteristics of the second row R2 of magnetic detection elements from differing from desired characteristics due to the bias magnetic fields.

The magnetic field generator 9 according to the fourth embodiment can be fabricated by the same method as the magnetic field generator 100 according to the first embodiment. As described in relation to the first embodiment, the direction of the magnetization of the first ferromagnetic material section 220 of each of two adjacent magnetic field generation units can be easily set without the need for increasing the distance between the two adjacent magnetic field generation units. According to the fourth embodiment, it is possible to provide the magnetic field generator 9 which includes the magnetic field generation units 201 to 204 and 211 to 214 arranged in a desired pattern and which has high immunity to disturbance magnetic fields, and to provide the magnetic sensor 5 including the magnetic field generator 9. Further, according to the fourth embodiment, a reduction in the distance between two adjacent magnetic field generation units serves to improve flexibility in the arrangement of the magnetic field generation units 201 to 204 and 211 to 214 and reduce the area to be occupied of the magnetic field generation units 201 to 204 and 211 to 214.

The magnetic sensor system of the fourth embodiment may include the scale 1 of the third embodiment shown in FIG. 16 or the scale 2 of the third embodiment shown in FIG. 20. The remainder of configuration, function and effects of the fourth embodiment are similar to those of the third embodiment.

Fifth Embodiment

Figure 23:
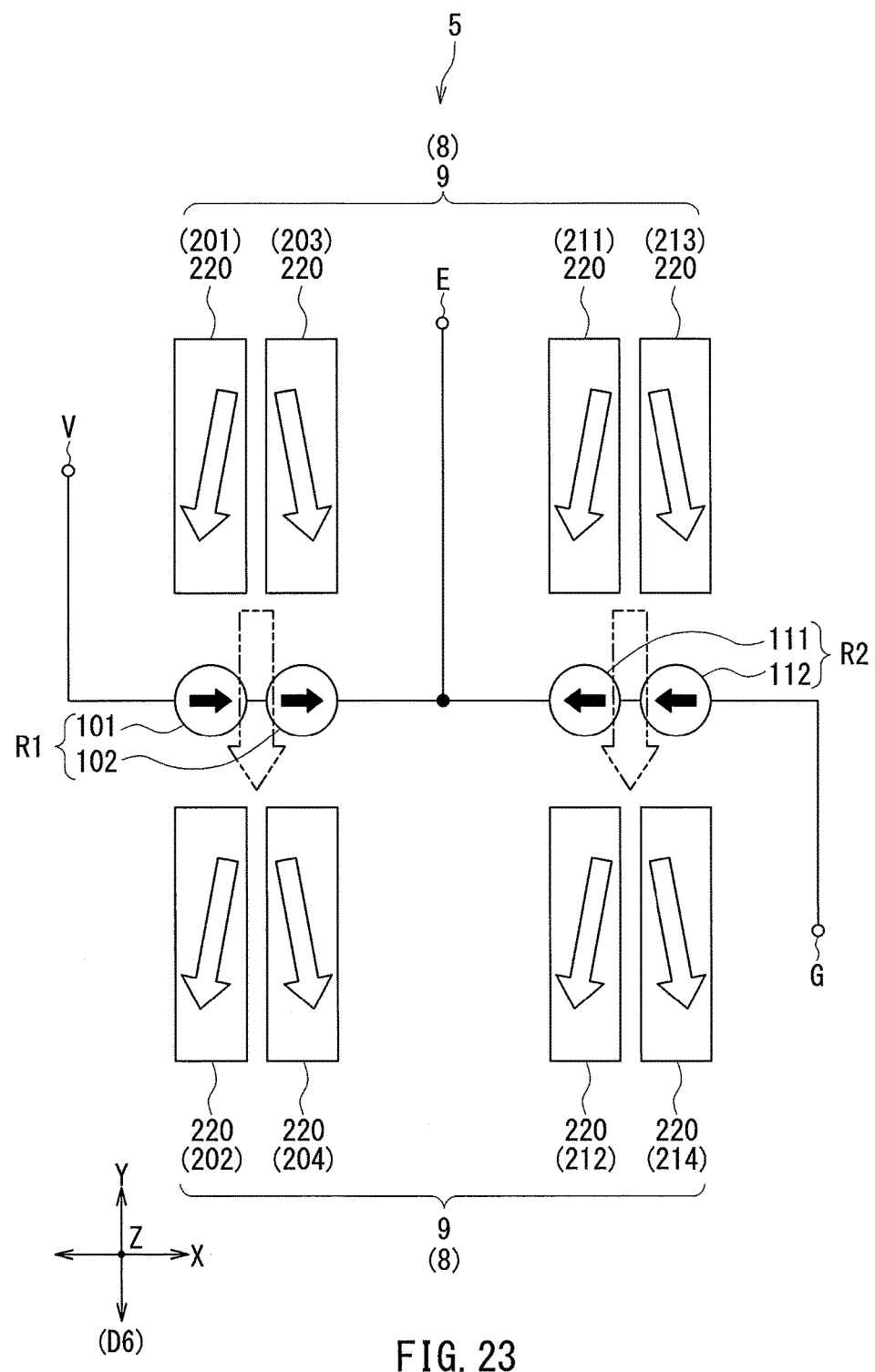
FIG. 23 is a circuit diagram of a magnetic sensor according to a fifth embodiment of the invention.

A fifth embodiment of the invention will now be described with reference to FIG. 23. FIG. 23 is a circuit diagram of a magnetic sensor according to the fifth embodiment. The magnetic sensor 5 according to the fifth embodiment differs from the magnetic sensor according to the fourth embodiment in the following ways. In the fifth embodiment, as shown in FIG. 23, the directions of the magnetizations of the first ferromagnetic material sections 220 of the magnetic field generation units 201 to 204 and 211 to 214 are all inclined with respect to both of the X and Y directions.

Now, a seventh direction and an eighth direction will be defined with respect to the sixth direction D6 shown in FIG. 23. The sixth direction D6 has been defined in relation to the fourth embodiment. In FIG. 23, the sixth direction D6 is downward. The seventh direction is the direction rotated clockwise from the sixth direction D6 by a first angle. The eighth direction is the direction rotated counterclockwise from the sixth direction D6 by a second angle. The first and second angles are greater than 0° and smaller than 90°. In FIG. 23 the seventh direction is toward the lower left. The eighth direction is toward the lower right. The magnetizations of the first ferromagnetic material sections 220 of the magnetic field generation units 201, 202, 211 and 212 are in the seventh direction. The magnetizations of the first ferromagnetic material sections 220 of the magnetic field generation units 203, 204, 213 and 214 are in the eighth direction. The first angle and the second angle are preferably equal.

In the fifth embodiment, both of the bias magnetic fields to be applied to the MR elements 101 and 102 result from the magnetizations of the four first ferromagnetic material sections 220 of the magnetic field generation units 201 to 204. In FIG. 23, the the arrows drawn in chain double-dashed lines in the vicinity of the MR elements 101 and 102 indicate the direction of the main components of the bias magnetic fields at the locations of the MR elements 101 and 102. In the fifth embodiment, in particular, the magnetization of each of the four first ferromagnetic material sections 220 of the magnetic field generation units 201 to 204 is set in such a direction that the main components of the bias magnetic fields at the locations of the MR elements 101 and 102 are oriented in the sixth direction D6.

On the other hand, both of the bias magnetic fields to be applied to the MR elements 111 and 112 result from the magnetizations of the four first ferromagnetic material sections 220 of the magnetic field generation units 211 to 214. In FIG. 23, the the arrows drawn in chain double-dashed lines in the vicinity of the MR elements 111 and 112 indicate the direction of the main components of the bias magnetic fields at the locations of the MR elements 111 and 112. In the fifth embodiment, in particular, the magnetization of each of the four first ferromagnetic material sections 220 of the magnetic field generation units 211 to 214 is set in such a direction that the main components of the bias magnetic fields at the locations of the MR elements 111 and 112 are oriented in the sixth direction D6.

In general, the sensitivity of an MR element and the strength range of a target magnetic field for the MR element are traded off and adjusted as needed. The sensitivity of the MR element and the strength range of the target magnetic field can be adjusted by the magnitude of a bias magnetic field to be applied to the MR element. In the fifth embodiment, the magnitude of the bias magnetic fields to be applied to the MR elements 101, 102, 111 and 112 is easily adjustable by, for example, adjusting the first and second angles. The fifth embodiment thus makes it possible to easily adjust the sensitivity of the MR elements 101, 102, 111 and 112 and the strength range of the target magnetic fields for the MR elements 101, 102, 111 and 112.

The remainder of configuration, function and effects of the fifth embodiment are similar to those of the fourth embodiment.

Sixth Embodiment

Figure 24:
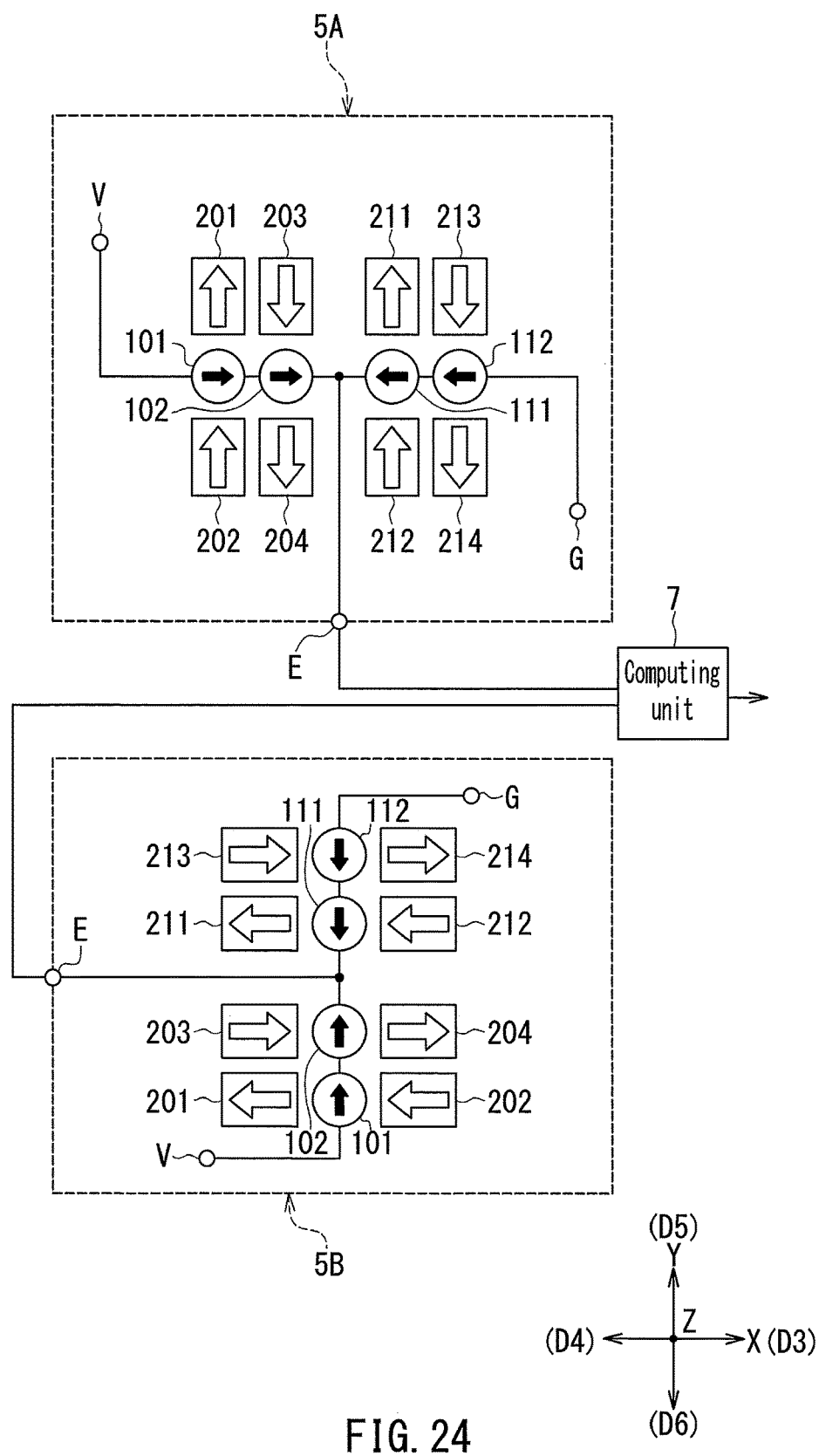
FIG. 24 is a circuit diagram illustrating the circuit configuration of a magnetic sensor system of a sixth embodiment of the invention.

A sixth embodiment of the invention will now be described with reference to FIG. 24. FIG. 24 is a circuit diagram illustrating the circuit configuration of a magnetic sensor system of the sixth embodiment. The magnetic sensor system of the sixth embodiment includes a first magnetic sensor 5A and a second magnetic sensor 5B according to the sixth embodiment, and is configured to detect the direction and magnitude of a target magnetic field. In the sixth embodiment, the target magnetic field is the earth's magnetic field or a magnetic field generated by any magnet, for example.

Each of the first and second magnetic sensors 5A and 5B has the same configuration as that of the magnetic sensor 5 according to the fourth embodiment. The arrangement of the MR elements 101, 102, 111 and 112 and the magnetic field generation units 201 to 204 and 211 to 214, the directions of the magnetizations of the magnetization pinned layers 13 of the MR elements 101, 102, 111 and 112, the directions of the magnetizations of the first ferromagnetic material sections 220 of the magnetic field generation units 201 to 204 and 211 to 214, and the directions of the bias magnetic fields to be applied to the MR elements 101, 102, 111 and 112 in the first magnetic sensor 5A are the same as those in the fourth embodiment.

The MR elements 101, 102, 111 and 112 and the magnetic field generation units 201 to 204 and 211 to 214 of the second magnetic sensor 5B are placed in such an orientation that the MR elements 101, 102, 111 and 112 and the magnetic field generation units 201 to 204 and 211 to 214 of the first magnetic sensor 5A are rotated counterclockwise by 90° in an XY plane. Thus, the magnetization pinned layers 13 of the MR elements 101, 102, 111 and 112 of the second magnetic sensor 5B have magnetization directions that are rotated counterclockwise by 90° in the XY plane from the magnetization directions of the magnetization pinned layers 13 of the MR elements 101, 102, 111 and 112 of the first magnetic sensor 5A. Likewise, the first ferromagnetic material sections 220 of the magnetic field generation units 201 to 204 and 211 to 214 of the second magnetic sensor 5B have magnetization directions that are rotated counterclockwise by 90° in the XY plane from the magnetization directions of the first ferromagnetic material sections 220 of the magnetic field generation units 201 to 204 and 211 to 214 of the first magnetic sensor 5A. Therefore, the bias magnetic fields to be applied to the MR elements 101, 102, 111 and 112 of the second magnetic sensor 5B are in directions that are rotated counterclockwise by 90° in the XY plane from the directions of the bias magnetic fields to be applied to the MR elements 101, 102, 111 and 112 of the first magnetic sensor 5A.

The output port E of the first magnetic sensor 5A outputs a first detection signal corresponding to the potential at the connection point between the MR elements 102 and 111 in the first magnetic sensor 5A. In the first magnetic sensor 5A, the potential at the connection point between the MR elements 102 and 111 varies depending on the strength of the X-directional component of the target magnetic field. The first detection signal represents the strength of the X-directional component of the target magnetic field.

The output port E of the second magnetic sensor 5B outputs a second detection signal corresponding to the potential at the connection point between the MR elements 102 and 111 in the second magnetic sensor 5B. In the second magnetic sensor 5B, the potential at the connection point between the MR elements 102 and 111 varies depending on the strength of a component of the target magnetic field in the Y direction (hereinafter, "Y-directional component of the target magnetic field"). The second detection signal represents the strength of the Y-directional component of the target magnetic field.

The magnetic sensor system of the sixth embodiment further includes a computing unit 7. The computing unit 7 has two inputs and an output. The two inputs of the computing unit 7 are connected to the respective output ports E of the first and second magnetic sensors 5A and 5B. On the basis of the first and second detection signals, the computing unit 7 computes an output signal that represents the direction and/or magnitude of the target magnetic field. The computing unit 7 can be implemented by a microcomputer, for example.

The first and second magnetic sensors 5A and 5B may each include a bias magnetic field generator formed of the magnetic field generator 9 according to the third embodiment, instead of the bias magnetic field generator formed of the magnetic field generator 9 according to the fourth embodiment. The remainder of configuration, function and effects of the sixth embodiment are similar to those of the third or fourth embodiment.

Seventh Embodiment

Figure 25:
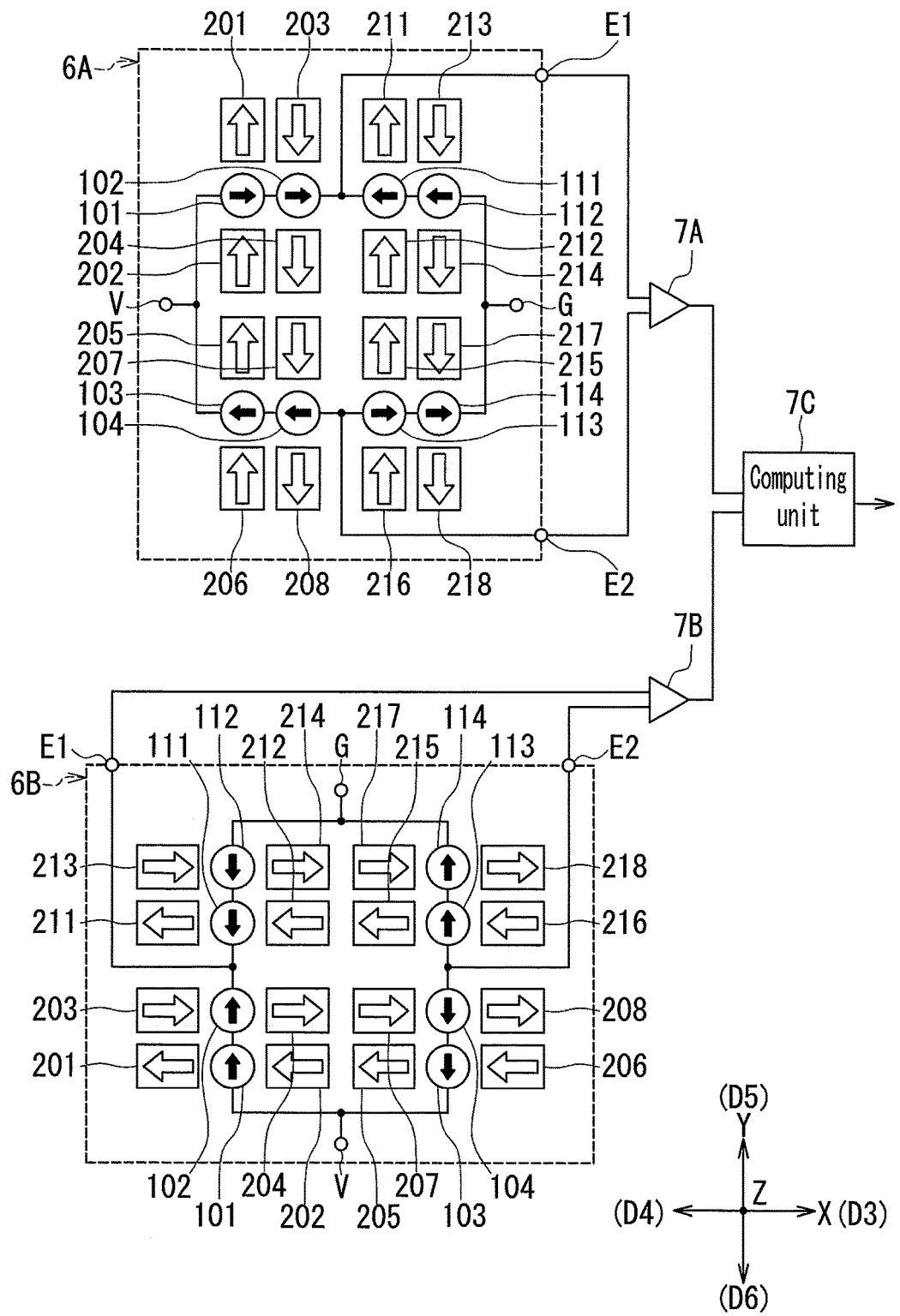
FIG. 25 is a circuit diagram illustrating the circuit configuration of a magnetic sensor system of a seventh embodiment of the invention.

A seventh embodiment of the invention will now be described with reference to FIG. 25. FIG. 25 is a circuit diagram illustrating the circuit configuration of a magnetic sensor system of the seventh embodiment. The magnetic sensor system of the seventh embodiment differs from that of the sixth embodiment in the following ways. The magnetic sensor system of the seventh embodiment includes a first magnetic sensor 6A and a second magnetic sensor 6B instead of the first magnetic sensor 5A and the second magnetic sensor 5B of the sixth embodiment. The first and second magnetic sensors 6A and 6B each include a plurality of MR elements, like the first and second magnetic sensors 5A and 5B.

The plurality of MR elements of the first magnetic sensor 6A include two MR elements 101 and 102 connected in series, two MR elements 111 and 112 connected in series, two MR elements 103 and 104 connected in series, and two MR elements 113 and 114 connected in series. The MR elements 101, 103, 111 and 113 each correspond to the first magnetic detection element of the present invention. The MR elements 102, 104, 112 and 114 each correspond to the second magnetic detection element of the present invention. The MR elements 101 to 104 and 111 to 114 each have the same configuration as that of the MR element 10 of the first embodiment.

The first magnetic sensor 6A includes a bias magnetic field generator formed of a magnetic field generator including a plurality of magnetic field generation units. The plurality of magnetic field generation units in the first magnetic sensor 6A include four first magnetic field generation units 201, 205, 211 and 215, four second magnetic field generation units 202, 206, 212 and 216, four third magnetic field generation units 203, 207, 213 and 217, and four fourth magnetic field generation units 204, 208, 214 and 218. The magnetic field generation units 201 to 204 and 211 to 214 have the same configuration as the magnetic field generation units 201 to 204 and 211 to 214 of the sixth embodiment. Likewise, the magnetic field generation units 205 to 208 and 215 to 218 also have the same configuration as the magnetic field generation units 201 to 204 and 211 to 214 of the sixth embodiment.

The first magnetic sensor 6A includes a first region in which the MR elements 101, 102, 111 and 112 and the magnetic field generation units 201 to 204 and 211 to 214 are located, and a second region in which the MR elements 103, 104, 113 and 114 and the magnetic field generation units 205 to 208 and 215 to 218 are located. FIG. 25 shows an example in which the first region and the second region are at locations different from each other in the Y direction.

The arrangement of the MR elements 101, 102, 111 and 112 and the magnetic field generation units 201 to 204 and 211 to 214 are the same as the arrangement of the MR elements 101, 102, 111 and 112 and the magnetic field generation units 201 to 204 and 211 to 214 in the first magnetic sensor 5A described in relation to the sixth embodiment. The arrangement of the MR elements 103, 104, 113 and 114 and the magnetic field generation units 205 to 208 and 215 to 218 are the same as the arrangement of the MR elements 101, 102, 111 and 112 and the magnetic field generation units 201 to 204 and 211 to 214, except that their locations are different in the Y direction.

The directions of the magnetizations of the magnetization pinned layers 13 of the MR elements 101, 101, 111 and 112, the directions of the magnetizations of the first ferromagnetic material sections 220 of the magnetic field generation units 201 to 204 and 211 to 214, and the directions of the bias magnetic fields to be applied to the MR elements 101, 102, 111 and 112 are the same as those in the first magnetic sensor 5A described in relation to the sixth embodiment.

The directions of the magnetizations of the magnetization pinned layers 13 of the MR elements 103, 104, 113 and 114 are opposite to those of the magnetization pinned layers 13 of the MR elements 101, 102, 111 and 112. The directions of the magnetizations of the first ferromagnetic material sections 220 of the magnetic field generation units 205 to 208 and 215 to 218 and the directions of the bias magnetic fields to be applied to the MR elements 103, 104, 113 and 114 are the same as the directions of the magnetizations of the first ferromagnetic material sections 220 of the magnetic field generation units 201 to 204 and 211 to 214 and the directions of the bias magnetic fields to be applied to the MR elements 101, 101, 111 and 112.

The first magnetic sensor 6A includes a first half-bridge circuit and a second half-bridge circuit. Each of the first and second half-bridge circuits includes a first row of magnetic detection elements and a second row of magnetic detection elements connected in series. The first row of magnetic detection elements of the first half-bridge circuit is constituted by the MR elements 101 and 102. The second row of magnetic detection elements of the first half-bridge circuit is constituted by the MR elements 111 and 112. The first row of magnetic detection elements of the second half-bridge circuit is constituted by the MR elements 103 and 104. The second row of magnetic detection elements of the second half-bridge circuit is constituted by the MR elements 113 and 114. The MR elements 101 to 104 and 111 to 114 constitute a Wheatstone bridge circuit.

The first magnetic sensor 6A further includes a power supply port V, a ground port G, a first output port E1 and a second output port E2. In the first half-bridge circuit, one end of the first row of magnetic detection elements is connected to the power supply port V. The other end of the first row of magnetic detection elements is connected to the first output port E1. One end of the second row of magnetic detection elements is connected to the first output port E1. The other end of the second row of magnetic detection elements is connected to the ground port G.

In the second half-bridge circuit, one end of the first row of magnetic detection elements is connected to the power supply port V. The other end of the first row of magnetic detection elements is connected to the second output port E2. One end of the second row of magnetic detection elements is connected to the second output port E2. The other end of the second row of magnetic detection elements is connected to the ground port G.

A power supply voltage of a predetermined magnitude is applied to the power supply port V. The ground port G is grounded. Each of the MR elements 101 to 104 and 111 to 114 varies in resistance depending on the target magnetic field. The resistances of the MR elements 101, 102, 113 and 114 vary in phase with each other. The resistances of the MR elements 103, 104, 111 and 112 vary 180° out of phase with the resistances of the MR elements 101, 102, 113 and 114. The first output port E1 outputs a first detection signal corresponding to the potential at the connection point between the first row of magnetic detection elements and the second row of magnetic detection elements, i.e., the connection point between the MR element 102 and the MR element 111, in the first half-bridge circuit. The second output port E2 outputs a second detection signal corresponding to the potential at the connection point between the first row of magnetic detection elements and the second row of magnetic detection elements, i.e., the connection point between the MR element 104 and the MR element 113, in the second half-bridge circuit. The first and second detection signals vary depending on the target magnetic field. The second detection signal is 180° out of phase with the first detection signal.

The second magnetic sensor 6B has the same configuration as the first magnetic sensor 6A. However, the MR elements 101 to 104 and 111 to 114 and the magnetic field generation units 201 to 208 and 211 to 218 of the second magnetic sensor 6B are placed in such an orientation that the MR elements 101 to 104 and 111 to 114 and the magnetic field generation units 201 to 208 and 211 to 218 of the first magnetic sensor 6A are rotated counterclockwise by 90° in the XY plane. Thus, the magnetization pinned layers 13 of the MR elements 101 to 104 and 111 to 114 of the second magnetic sensor 6B have magnetization directions that are rotated counterclockwise by 90° in the XY plane from the magnetization directions of the magnetization pinned layers 13 of the MR elements 101 to 104 and 111 to 114 of the first magnetic sensor 6A. Likewise, the first ferromagnetic material sections 220 of the magnetic field generation units 201 to 208 and 211 to 218 of the second magnetic sensor 6B have magnetization directions that are rotated counterclockwise by 90° in the XY plane from the magnetization directions of the first ferromagnetic material sections 220 of the magnetic field generation units 201 to 208 and 211 to 218 of the first magnetic sensor 6A. Therefore, the bias magnetic fields to be applied to the MR elements 101 to 104 and 111 to 118 of the second magnetic sensor 6B are in directions that are rotated counterclockwise by 90° in the XY plane from the directions of the bias magnetic fields to be applied to the MR elements 101 to 104 and 111 to 118 of the first magnetic sensor 6A.

In the first magnetic sensor 6A, the potential at the connection point between the MR elements 102 and 111 in the first magnetic sensor 6A and the potential at the connection point between the MR elements 104 and 113 in the first magnetic sensor 6A vary depending on the strength of the X-directional component of the target magnetic field. The first and second detection signals of the first magnetic sensor 6A represent the strength of the X-directional component of the target magnetic field.

In the second magnetic sensor 6B, the potential at the connection point between the MR elements 102 and 111 in the second magnetic sensor 6B and the potential at the connection point between the MR elements 104 and 113 in the second magnetic sensor 6B vary depending on the strength of the Y-directional component of the target magnetic field. The first and second detection signals of the second magnetic sensor 6B represent the strength of the Y-directional component of the target magnetic field.

The magnetic sensor system of the seventh embodiment further includes two differential circuits 7A and 7B and a computing unit 7C. The differential circuits 7A and 7B and the computing unit 7C each have two inputs and an output. The two inputs of the differential circuit 7A are respectively connected to the first and second output ports E1 and E2 of the first magnetic sensor 6A. The two inputs of the differential circuit 7B are respectively connected to the first and second output ports E1 and E2 of the second magnetic sensor 6B. The two inputs of the computing unit 7C are connected to the respective outputs of the differential circuits 7A and 7B.

The differential circuit 7A outputs a first computation signal generated by a computation that includes determining the difference between the first detection signal and the second detection signal of the first magnetic sensor 6A. The differential circuit 7B outputs a second computation signal generated by a computation that includes determining the difference between the first detection signal and the second detection signal of the second magnetic sensor 6B. On the basis of the first and second computation signals, the computing unit 7C computes an output signal representing the direction and/or magnitude of the target magnetic field. The differential circuits 7A and 7B and the computing unit 7C can be implemented by a single microcomputer, for example.

The first and second magnetic sensors 6A and 6B may each include a bias magnetic field generator formed of the magnetic field generator 9 according to the third embodiment, instead of the bias magnetic field generator of the seventh embodiment. The remainder of configuration, function and effects of the seventh embodiment are similar to those of the third or sixth embodiment.

The present invention is not limited to the foregoing embodiments, and various modifications may be made thereto. For example, as far as the requirements of the appended claims are met, the number, shape and arrangement of the plurality of MR elements and the plurality of magnetic field generation units can be freely chosen without being limited to the examples illustrated in the foregoing embodiments.

Further, the MR element 10 may be formed by stacking the underlayer 11, the free layer 15, the nonmagnetic layer 14, the magnetization pinned layer 13, the antiferromagnetic layer 12, and the protective layer 16 in this order from the lower electrode 40 side.

Obviously, many modifications and variations of the present invention are possible in the light of the above teachings. Thus, it is to be understood that, within the scope of the appended claims and equivalents thereof, the invention may be practiced in other than the foregoing most preferable embodiments.

What is claimed is:

1. A magnetic field generator comprising a plurality of magnetic field generation units arranged in a predetermined pattern to generate a plurality of external magnetic fields, wherein
each of the plurality of magnetic field generation units includes a first ferromagnetic material section and a first antiferromagnetic material section,
the first antiferromagnetic material section is in contact with and exchange-coupled to the first ferromagnetic material section,
the first ferromagnetic material section has an overall magnetization, and
the plurality of magnetic field generation units includes first and second magnetic field generation units configured so that the overall magnetization of the first ferromagnetic material section of the first magnetic field generation unit is in a different direction from the overall magnetization of the first ferromagnetic material section of the second magnetic field generation unit.

2. The magnetic field generator according to claim 1, wherein
the first ferromagnetic material section includes a plurality of constituent layers stacked on each other, and
the plurality of constituent layers include a first ferromagnetic layer in contact with the first antiferromagnetic material section.

3. The magnetic field generator according to claim 2, wherein the plurality of constituent layers further include a second ferromagnetic layer which is located farther from the first antiferromagnetic material section than the first ferromagnetic layer.

4. The magnetic field generator according to claim 3, wherein the plurality of constituent layers further include a nonmagnetic layer interposed between the first ferromagnetic layer and the second ferromagnetic layer.

5. The magnetic field generator according to claim 4, wherein
the first ferromagnetic layer and the second ferromagnetic layer are ferromagnetically exchange-coupled to each other via the nonmagnetic layer, and
each of the first ferromagnetic layer and the second ferromagnetic layer has a magnetization in the same direction as the overall magnetization of the first ferromagnetic material section.

6. The magnetic field generator according to claim 4, wherein
the first ferromagnetic layer and the second ferromagnetic layer are antiferromagnetically exchange-coupled to each other via the nonmagnetic layer, and
the second ferromagnetic layer has a magnetization in the same direction as the overall magnetization of the first ferromagnetic material section.

7. The magnetic field generator according to claim 1, wherein
the first ferromagnetic material section has a first surface and a second surface opposite to each other,
the first antiferromagnetic material section is in contact with the first surface of the first ferromagnetic material section, and
each of the plurality of magnetic field generation units further includes a second antiferromagnetic material section in contact with the second surface of the first ferromagnetic material section and exchange-coupled to the first ferromagnetic material section.

8. The magnetic field generator according to claim 7, wherein the first and second antiferromagnetic material sections have different blocking temperatures.

9. The magnetic field generator according to claim 1, wherein
the first antiferromagnetic material section has a first surface and a second surface opposite to each other,
the first ferromagnetic material section is in contact with the first surface of the first antiferromagnetic material section,
each of the plurality of magnetic field generation units further includes a second ferromagnetic material section in contact with the second surface of the first antiferromagnetic material section and exchange-coupled to the first antiferromagnetic material section, and the second ferromagnetic material section has an overall magnetization.

10. A magnetic sensor system comprising a scale and a magnetic sensor arranged in a variable relative positional relationship with each other, the magnetic sensor system being configured to detect a physical quantity associated with the relative positional relationship between the scale and the magnetic sensor, wherein the scale is formed of a magnetic field generator, the magnetic field generator includes a plurality of magnetic field generation units arranged in a predetermined pattern to generate a plurality of external magnetic fields, each of the plurality of magnetic field generation units includes a first ferromagnetic material section and a first antiferromagnetic material section, the first antiferromagnetic material section is in contact with and exchange-coupled to the first ferromagnetic material section, the first ferromagnetic material section has an overall magnetization, and the plurality of magnetic field generation units includes first and second magnetic field generation units configured so that the overall magnetization of the first ferromagnetic material section of the first magnetic field generation unit is in a different direction from the overall magnetization of the first ferromagnetic material section of the second magnetic field generation unit.

11. The magnetic sensor system according to claim 10, wherein the plurality of magnetic field generation units are arranged in a row, and any two adjacent ones of the plurality of magnetic field generation units are configured so that the overall magnetizations of their respective first ferromagnetic material sections are in different directions from each other.

12. The magnetic sensor system according to claim 11, wherein the direction of the overall magnetization of the first ferromagnetic material section of one of the two adjacent magnetic field generation units and the direction of the overall magnetization of the first ferromagnetic material section of the other of the two adjacent magnetic field generation units intersect a direction in which the row of the plurality of magnetic field generation units extends and are opposite to each other.

13. The magnetic sensor system according to claim 10, wherein the plurality of magnetic field generation units are annularly arranged to form an aggregation having an outer periphery and an inner periphery, and any two adjacent ones of the plurality of magnetic field generation units are configured so that the overall magnetizations of their respective first ferromagnetic material sections are in different directions from each other.

14. The magnetic sensor system according to claim 13, wherein the overall magnetization of the first ferromagnetic material section of one of the two adjacent magnetic field generation units is in a direction from the outer periphery to the inner periphery, and the overall magnetization of the first ferromagnetic material section of the other of the two adjacent magnetic field generation units is in a direction from the inner periphery to the outer periphery.

15. A magnetic sensor comprising:

a plurality of magnetic detection elements for detecting a magnetic field to be detected; and a bias magnetic field generator for generating a plurality of bias magnetic fields to be applied to the plurality of magnetic detection elements, wherein the bias magnetic field generator is formed of a magnetic field generator, the magnetic field generator includes a plurality of magnetic field generation units arranged in a predetermined pattern to generate a plurality of external magnetic fields, each of the plurality of magnetic field generation units includes a first ferromagnetic material section and a first antiferromagnetic material section, the first antiferromagnetic material section is in contact with and exchange-coupled to the first ferromagnetic material section, the first ferromagnetic material section has an overall magnetization, the plurality of magnetic field generation units includes first and second magnetic field generation units configured so that the overall magnetization of the first ferromagnetic material section of the first magnetic field generation unit is in a different direction from the overall magnetization of the first ferromagnetic material section of the second magnetic field generation unit, and each of the plurality of bias magnetic fields results from the overall magnetization of the first ferromagnetic material section of at least one of the plurality of magnetic field generation units.

16. The magnetic sensor according to claim 15, wherein each of the plurality of magnetic detection elements is a magnetoresistance element.

17. The magnetic sensor according to claim 16, wherein the magnetoresistance element includes: a magnetization pinned layer having a magnetization pinned in a certain direction; a free layer having a magnetization that varies depending on the magnetic field to be detected; and a nonmagnetic layer located between the magnetization pinned layer and the free layer.

18. The magnetic sensor according to claim 17, wherein the overall magnetization of the first ferromagnetic material section of any one of the plurality of magnetic field generation units is in a direction intersecting the direction of the magnetization of the magnetization pinned layer of a specific magnetoresistance element that is to be subjected to a bias magnetic field resulting from the overall magnetization of the first ferromagnetic material section of the one of the plurality of magnetic field generation units.

19. The magnetic sensor according to claim 15, wherein the plurality of magnetic detection elements include a first magnetic detection element and a second magnetic detection element connected in series, the plurality of magnetic field generation units include a first magnetic field generation unit and a second magnetic field generation unit, a bias magnetic field to be applied to the first magnetic detection element results from the overall magnetization of the first ferromagnetic material section of the first magnetic field generation unit, a bias magnetic field to be applied to the second magnetic detection element results from the overall magnetization of the first ferromagnetic material section of the second magnetic field generation unit, and the first and second magnetic field generation units are configured so that the overall magnetizations of their respective first ferromagnetic material sections are in different directions from each other.

20. The magnetic sensor according to claim 15, wherein the plurality of magnetic detection elements includes a first magnetic detection element and a second magnetic detection element connected in series, the plurality of magnetic field generation units includes a first to a fourth magnetic field generation unit, a bias magnetic field to be applied to the first magnetic detection element results from the overall magnetization of the first ferromagnetic material section of the first magnetic field generation unit and the overall magnetization of the first ferromagnetic material section of the second magnetic field generation unit, a bias magnetic field to be applied to the second magnetic detection element results from the overall magnetization of the first ferromagnetic material section of the third magnetic field generation unit and the overall magnetization of the first ferromagnetic material section of the fourth magnetic field generation unit, the first and third magnetic field generation units are adjacent to each other and configured so that the overall magnetizations of their respective first ferromagnetic material sections are in different directions from each other, and the second and fourth magnetic field generation units are adjacent to each other and configured so that the overall magnetizations of their respective first ferromagnetic material sections are in different directions from each other.

* * * * *